United States Patent
Yun et al.

(10) Patent No.: US 12,362,232 B2
(45) Date of Patent: Jul. 15, 2025

(54) POLISHING PAD AND METHOD FOR PREPARING SEMICONDUCTOR DEVICE USING THE SAME

(71) Applicant: SK enpulse Co., Ltd., Gyeonggi-do (KR)

(72) Inventors: Jong Wook Yun, Gyeonggi-do (KR); Hyeyoung Heo, Gyeonggi-do (KR); Jaein Ahn, Gyeonggi-do (KR); Kyung Hwan Kim, Gyeonggi-do (KR)

(73) Assignee: SK ENPULSE CO., LTD., Gyeonggi-do (KR)

( * ) Notice: Subject to any disclaimer, the term of this patent is extended or adjusted under 35 U.S.C. 154(b) by 0 days.

(21) Appl. No.: 17/399,849

(22) Filed: Aug. 11, 2021

(65) Prior Publication Data

US 2022/0059401 A1 Feb. 24, 2022

(30) Foreign Application Priority Data

Aug. 24, 2020 (KR) .................. 10-2020-0106555
Aug. 24, 2020 (KR) .................. 10-2020-0106556
(Continued)

(51) Int. Cl.
*B24B 37/20* (2012.01)
*B24B 37/04* (2012.01)
(Continued)

(52) U.S. Cl.
CPC ........ *H01L 21/7684* (2013.01); *B24B 37/044* (2013.01); *B24B 37/20* (2013.01);
(Continued)

(58) Field of Classification Search
CPC ..... B24B 37/044; B24B 37/046; B24B 37/20; B24B 37/22; B24B 37/24; B24D 3/20;
(Continued)

(56) References Cited

U.S. PATENT DOCUMENTS 6,913,517 B2 * 7/2005 Prasad .................... B24B 37/24
451/526
9,630,293 B2 * 4/2017 Qian ....................... B24B 37/24
(Continued)

FOREIGN PATENT DOCUMENTS

EP 1129821 A1 * 9/2001 ............. B24B 37/22
JP 2010-180411 A 8/2010
(Continued)

OTHER PUBLICATIONS

Machine Translation of JP 2018051698 to Tateno et al., "Tateno Translation" (Year: 2018).*
(Continued)

*Primary Examiner* — Monica S Carter
*Assistant Examiner* — Jonathan R Zaworski
(74) *Attorney, Agent, or Firm* — IP & T GROUP LLP

(57) ABSTRACT

The present invention provides a polishing pad, a process for preparing the same, and a process for preparing a semiconductor device using the same. In the polishing pad, the surface zeta potential and its ratio of the polishing surface are controlled to specific ranges according to the type of polishing slurry, whereby it is possible to improve the characteristics of scratches and surface defects appearing on the surface of the semiconductor substrate and to further enhance the polishing rate.

15 Claims, 4 Drawing Sheets

(30) Foreign Application Priority Data

Aug. 24, 2020 (KR) .................. 10-2020-0106557
Aug. 24, 2020 (KR) .................. 10-2020-0106558

(51) Int. Cl.
| | | |
|---|---|---|
| *B24B 37/24* | (2012.01) | |
| *B24B 53/017* | (2012.01) | |
| *H01L 21/3105* | (2006.01) | |
| *H01L 21/321* | (2006.01) | |
| *H01L 21/768* | (2006.01) | |

(52) U.S. Cl.
CPC ............ *B24B 37/24* (2013.01); *B24B 53/017* (2013.01); *H01L 21/31053* (2013.01); *H01L 21/3212* (2013.01)

(58) Field of Classification Search
CPC ... B24D 3/22; B24D 3/26; B24D 3/32; B24D 3/34
See application file for complete search history.

(56) References Cited

U.S. PATENT DOCUMENTS

| | | |
|---|---|---|
| 10,464,188 B1 | 11/2019 | Gadinski et al. |
| 10,569,384 B1 | 2/2020 | Gadinski et al. |
| 2005/0079806 A1 | 4/2005 | James et al. |
| 2016/0176013 A1 | 6/2016 | Qian et al. |
| 2018/0339393 A1* | 11/2018 | Ahn ................. B24B 37/22 |
| 2018/0345449 A1 | 12/2018 | Weis et al. |
| 2019/0232460 A1 | 8/2019 | Takegoshi et al. |
| 2020/0230780 A1* | 7/2020 | Miyasaka ........... C08G 18/4825 |
| 2020/0347268 A1 | 11/2020 | Kamimura |
| 2021/0276143 A1* | 9/2021 | Oshita ................ C08G 18/698 |

FOREIGN PATENT DOCUMENTS

| | | | |
|---|---|---|---|
| JP | 2014-069260 A | | 4/2014 |
| JP | 2018051698 A | * | 4/2018 |
| JP | 2019-024079 A | | 2/2019 |
| KR | 10-2010-0065386 A | | 6/2010 |
| KR | 10-1608901 B1 | | 4/2016 |
| KR | 10-2018-0063363 A | | 6/2018 |
| KR | 10-2020-0052227 A | | 5/2020 |
| TW | 201808530 A | | 3/2018 |
| TW | 201940616 A | | 10/2019 |
| WO | 2009/042073 A2 | | 4/2009 |
| WO | 2012090755 A1 | | 7/2012 |
| WO | 2017/074773 A1 | | 5/2017 |
| WO | 2019/216279 A1 | | 11/2019 |

OTHER PUBLICATIONS

Office Action for the Japanese Patent Application No. 2021-136421 issued by the Japanese Patent Office on Oct. 4, 2022.
Office Action for the Singapore Patent Application No. 10202108639V issued by the Singapore Patent Office on Oct. 4, 2022.
Extended European Search Report issued by the European Patent Office on Jan. 28, 2022.
Office Action of Korean Patent Application No. 10-2020-0106555 issued by the Korean Patent Office on Dec. 10, 2021.
Office Action of Korean Patent Application No. 10-2020-0106557 issued by the Korean Patent Office on Dec. 16, 2021.
Office Action for the Taiwanese Patent Application No. 110129664 issued by the Taiwanese Patent Office on Oct. 13, 2022.
Office Action for the Japanese Patent Application No. 2023-032028 issued by the JapanesePatent Office on May 28, 2024.

* cited by examiner

[Fig. 1]
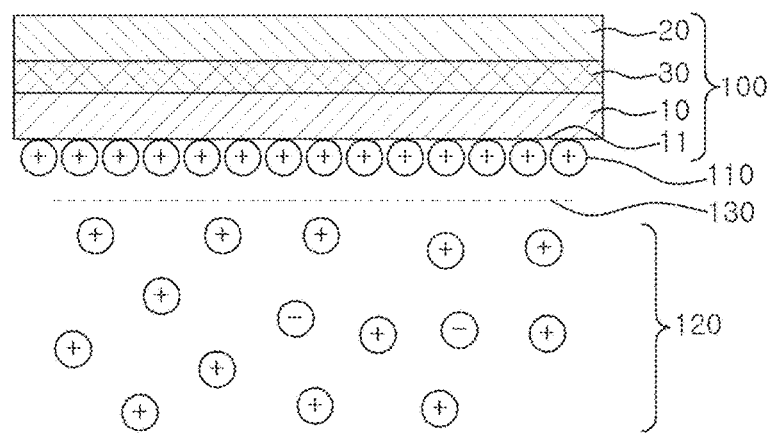
[Fig. 2]
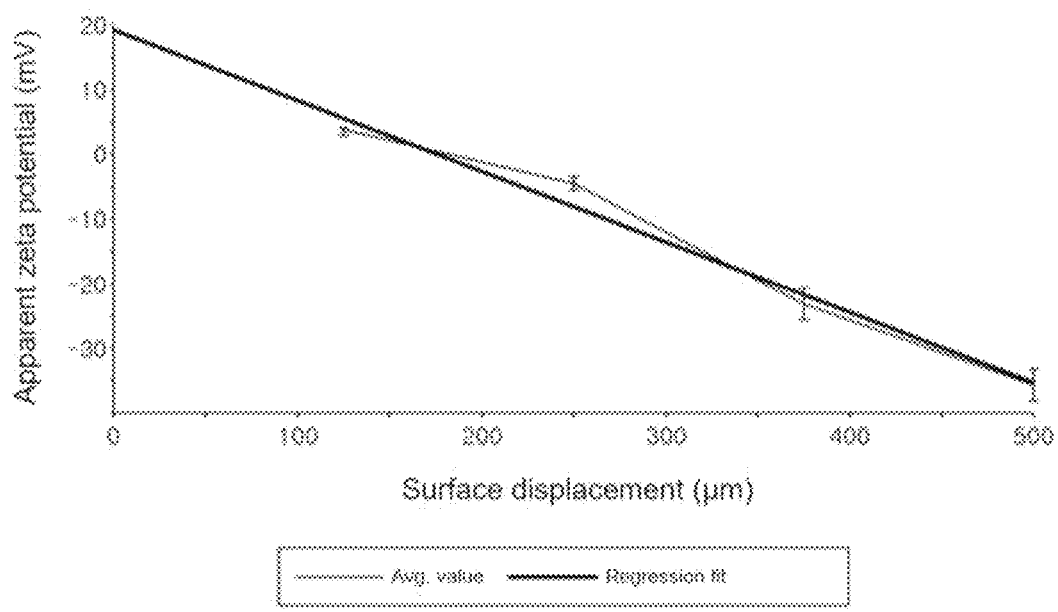

[Fig. 3]
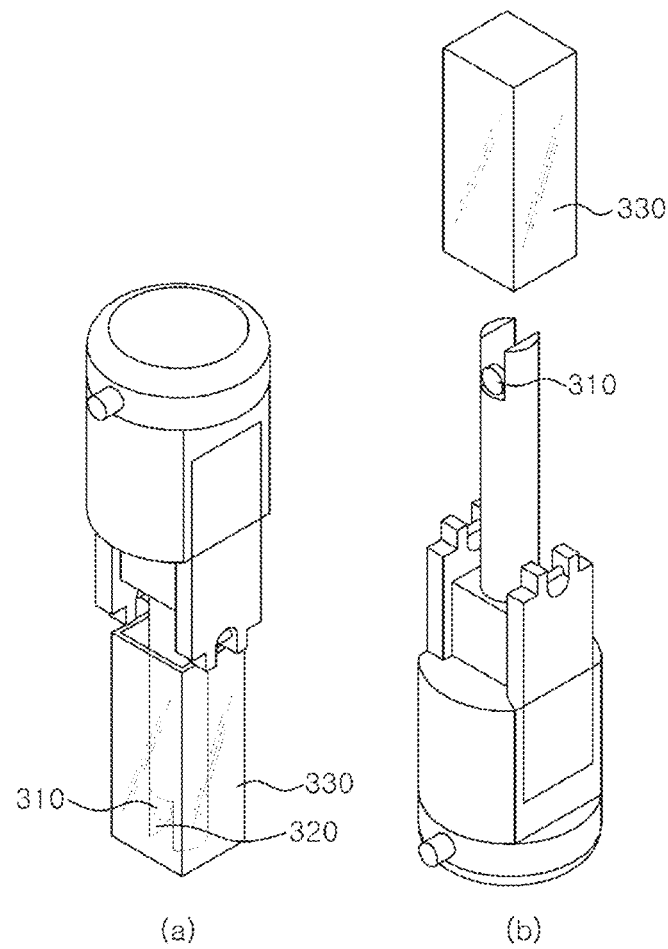

[Fig. 4]
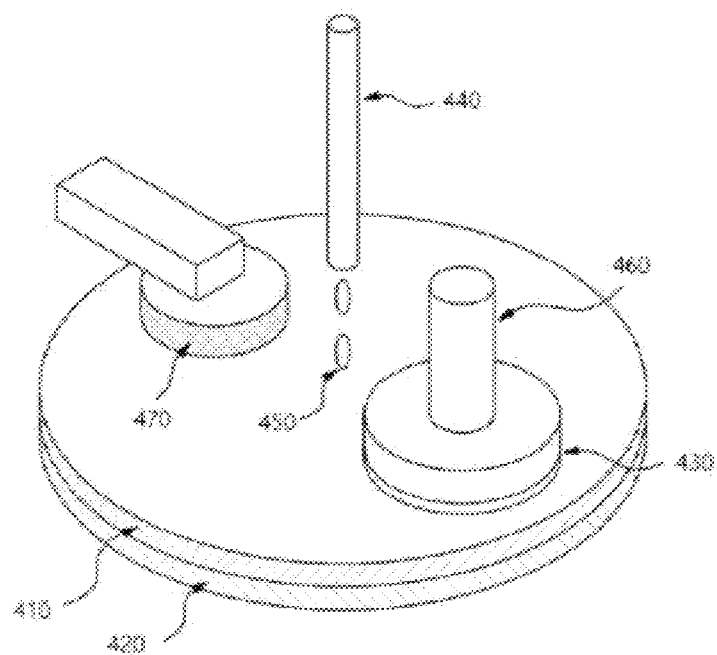

[Fig. 5]
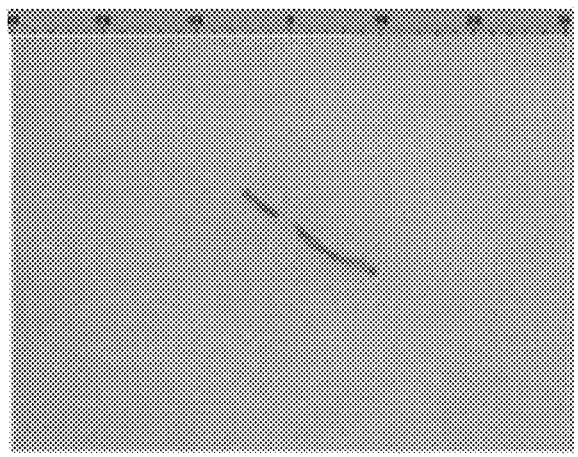
[Fig. 6]
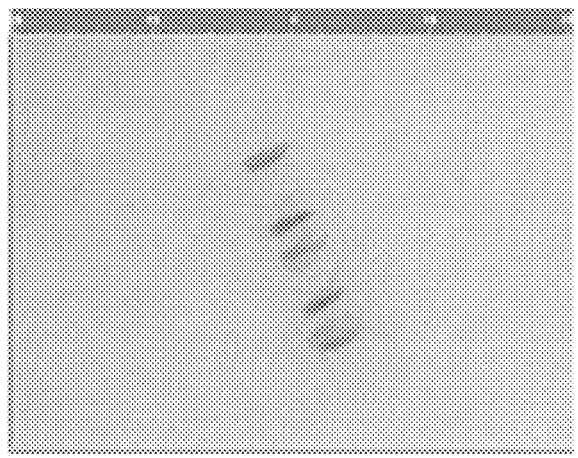

POLISHING PAD AND METHOD FOR PREPARING SEMICONDUCTOR DEVICE USING THE SAME

The present application claims priority of Korean patent application number 10-2020-0106555, 10-2020-0106556, 10-2020-0106557 and 10-2020-0106558 filed on Aug. 24, 2020. The disclosure of each of the foregoing applications is incorporated herein by reference in its entirety.

TECHNICAL FIELD

The present invention relates to a pad used in a polishing process and to a technique of using such a pad in a process for preparing a semiconductor device.

BACKGROUND ART

A chemical mechanical planarization (CMP) or chemical mechanical polishing (CMP) process may be carried out for various purposes in various technical fields. The CMP process is carried out on a certain side of an object to be polished. It may be carried out for the purposes of planarization of the side to be polished, removal of aggregated materials, resolution of damage to the crystal lattice, and removal of scratches and contamination sources.

The CMP process technology in the semiconductor process may be classified according to the quality of the film substance to be polished or the shape of the surface after polishing. For example, it may be divided into single silicon or polysilicon according to the film substance to be polished. It may be classified into CMP processes for various oxide layers according to the type of impurities or metal layers such as tungsten (W), copper (Cu), aluminum (Al), ruthenium (Ru), and tantalum (Ta). In addition, according to the surface shape after polishing, it may be classified into a process of alleviating the roughness of the substrate surface, a process of planarizing a step caused by multilayered circuit wiring, and a device isolation process for selectively forming circuit wiring after polishing.

The CMP process may be carried out several times in the process of preparing a semiconductor device. A semiconductor device comprises a plurality of layers, and each layer comprises a complex and fine circuit pattern. In addition, in recent years, the sizes of individual chips of a semiconductor device are reduced, and the pattern of each layer is evolving to be more complex and finer. Accordingly, in the process of preparing a semiconductor device, the purpose of the CMP process has been expanded not only for the purpose of planarizing the circuit wiring, but also for the separation of the circuit wiring and the application of improvement of the wiring surface, and the like. As a result, more sophisticated and reliable CMP performance is required.

A polishing pad used in the CMP process is a process component that machines the side to be polished to a required level through friction. It may be one of the most important factors in terms of the thickness uniformity of the object to be polished after polishing, the flatness of the polished surface, and the polishing quality.

PRIOR ART DOCUMENT

Patent Document (Patent Document 1) Korean Patent No. 10-1608901

DETAILED DESCRIPTION OF THE INVENTION

Technical Problem

An object of the present invention is to provide a polishing pad and a process for preparing the same in which the surface zeta potential and its ratio of the polishing pad are controlled to specific ranges according to the type of polishing slurry, whereby it is possible to improve the characteristics of surface defects such as scratches and chatter marks appearing on the surface of the semiconductor substrate and to continuously and discontinuously apply a single polishing pad to the respective process steps in various environments regardless of the type of silica and the type of the target layer to be polished while achieving an appropriate polishing rate for all of them.

Another object of the present invention is to provide a process for preparing a semiconductor device useful for a layer to be polished of both an oxide layer and a tungsten layer using the polishing pad while achieving an appropriate polishing rate.

Solution to the Problem

The present invention provides a polishing pad, which comprises a polishing layer, wherein when polishing is carried out using a first composition having a hydrogen ion concentration (pH) of 8 to 12, the polishing surface of the polishing layer has a first surface zeta potential (PZ1), which is a value of surface zeta potential of the polishing surface derived by the following Relationship 1 for the first composition; when polishing is carried out using a second composition having a hydrogen ion concentration (pH) of 2 to 6, the polishing surface of the polishing layer has a second surface zeta potential (PZ2), which is a value of surface zeta potential of the polishing surface derived by the following Relationship 1 for the second composition; and at least one of the first surface zeta potentials (PZ1) and at least one of the second surface zeta potentials (PZ2) satisfy the following Relationship 2:

Surface zeta potential=(−) zeta potential of the fixed layer+zeta potential of the composition    [Relationship 1]

$$-20 \leq \frac{PZ1}{PZ2} \leq 0. \quad \text{[Relationship 2]}$$

In another embodiment, the present invention provides a process for preparing a polishing pad, which comprises preparing a prepolymer composition; preparing a composition for preparing a polishing layer comprising the prepolymer composition, a foaming agent, and a curing agent; and curing the composition for preparing a polishing layer to prepare a polishing layer, wherein when polishing is carried out using a first composition having a hydrogen ion concentration (pH) of 8 to 12, the polishing surface of the polishing layer has a first surface zeta potential (PZ1), which is a value of surface zeta potential of the polishing surface derived by the above Relationship 1 for the first composition; when polishing is carried out using a second composition having a hydrogen ion concentration (pH) of 2 to 6, the polishing surface of the polishing layer has a second surface zeta potential (PZ2), which is a value of surface zeta potential of the polishing surface derived by the above Relationship 1 for the second composition; and at least one of the first surface zeta potentials (PZ1) and at least one of the second surface zeta potentials (PZ2) satisfy the above Relationship 2.

In still another embodiment, the present invention provides a process for preparing a semiconductor device, which comprises providing a polishing pad comprising a polishing layer; and relatively rotating the polishing surface of the polishing layer and the surface of an object to be polished while they are in contact with each other to polish the object to be polished, wherein the object to be polished comprises an oxide layer, a tungsten layer, or a composite layer thereof, and when polishing is carried out using a first composition having a hydrogen ion concentration (pH) of 8 to 12, the polishing surface of the polishing layer has a first surface zeta potential (PZ1), which is a value of surface zeta potential of the polishing surface derived by the above Relationship 1 for the first composition; when polishing is carried out using a second composition having a hydrogen ion concentration (pH) of 2 to 6, the polishing surface of the polishing layer has a second surface zeta potential (PZ2), which is a value of surface zeta potential of the polishing surface derived by the above Relationship 1 for the second composition; and at least one of the first surface zeta potentials (PZ1) and at least one of the second surface zeta potentials (PZ2) satisfy the above Relationship 2.

Advantageous Effects of the Invention

In the polishing pad according to the embodiment, the surface zeta potential and its ratio of the polishing pad are controlled to specific ranges according to the type of polishing slurry, whereby it is possible to improve the characteristics of surface defects such as scratches and chatter marks appearing on the surface of the semiconductor substrate and to further enhance the polishing rate.

In particular, in the polishing pad according to the embodiment, the surface zeta potential of the polishing pad is controlled, whereby it is possible to achieve an appropriate polishing rate in a polishing environment where an oxide layer and a tungsten layer are polished with a single polishing pad, as well as to continuously or discontinuously apply a single polishing pad to the respective process steps in the above environments.

In addition, in the polishing pad according to the embodiment, the surface zeta potential of the polishing pad is controlled, whereby it is possible to minimize such surface defects as scratches and chatter marks, while achieving an appropriate polishing rate, in various processes such as bulk and fine processes for an oxide layer with a single polishing pad, as well as to continuously or discontinuously apply a single polishing pad to the respective process steps in the above environments.

In addition, in the polishing pad according to the embodiment, the surface zeta potential of the polishing pad is controlled, whereby it is possible to achieve an appropriate range of polishing performance for both silica and ceria slurries with a single polishing pad, as well as to continuously or discontinuously apply a single polishing pad to the respective process steps in the above environments.

Further, in the polishing pad according to the embodiment, the surface zeta potential of the polishing pad is controlled, whereby it is possible to achieve an appropriate range of polishing performance for acidic and basic slurry environments or for silica and ceria slurries with a single polishing pad, as well as to continuously or discontinuously apply a single polishing pad to the respective process steps in the above environments.

BRIEF DESCRIPTION OF THE DRAWINGS

FIG. 1 is a diagram for illustrating the surface zeta potential of a polishing pad according to an embodiment.

FIG. 2 is a graph showing the apparent zeta potential according to the surface displacement of the polishing pad of Example 1 and the surface zeta potential of the polishing pad derived therefrom.

FIG. 3 is a schematic diagram illustrating a surface zeta potential cell in an apparatus for measuring the surface zeta potential of a polishing pad according to an embodiment.

FIG. 4 schematically illustrates a process for preparing a semiconductor device according to an embodiment.

FIG. 5 is a photograph showing the shape of a scratch on a wafer according to an embodiment.

FIG. 6 is a photograph showing the shape of a chatter mark on a wafer according to an embodiment.

BEST MODE FOR CARRYING OUT THE INVENTION

Advantages and features of the present invention and methods for achieving the same will become apparent with reference to the following embodiments. However, the present invention is not limited to the embodiments disclosed below, and it will be implemented in a variety of different forms. These embodiments allow the disclosure of the present invention to be complete, and to fully inform a person of ordinary skill in the art to which the present invention pertains of the scope of the invention. The present invention is only defined by the scope of the claims.

In order to clearly express various layers and regions in the drawings, the thicknesses are enlarged. For the convenience of explanation, the thickness of some layers and regions is exaggerated in the drawings. The same reference numerals refer to the same elements throughout the present specification.

In addition, as used herein, when a part, such as a layer, film, region, plate, or the like, is "above" or "on" another part, it encompasses not only cases where it is "directly on" another part, but also cases where there is another part in between. Conversely, when a part is "directly on" another part, it means that there is no other part in between. In addition, when a part, such as a layer, film, region, plate, or the like, is "below" or "under" another part, it encompasses not only cases where it is "directly under" another part, but also cases where there is another part in between. Conversely, when a part is "directly under" another part, it means that there is no other part in between.

In an embodiment of the present invention, there is provided a polishing pad, which comprises a polishing layer, wherein when polishing is carried out using a first composition having a hydrogen ion concentration (pH) of 8 to 12, the polishing surface of the polishing layer has a first surface zeta potential (PZ1), which is a value of surface zeta potential of the polishing surface derived by the following Relationship 1 for the first composition; when polishing is carried out using a second composition having a hydrogen ion concentration (pH) of 2 to 6, the polishing surface of the polishing layer has a second surface zeta potential (PZ2), which is a value of surface zeta potential of the polishing surface derived by the following Relationship 1 for the second composition; and at least one of the first surface zeta potentials (PZ1) and at least one of the second surface zeta potentials (PZ2) satisfy the following Relationship 2:

Surface zeta potential=(−) zeta potential of the fixed layer+zeta potential of the composition   [Relationship 1]

$$-20 \le \frac{PZ1}{PZ2} \le 0.$$   [Relationship 2]

The polishing process in a process for fabricating semiconductors is carried out in a way in which a polishing pad, a polishing slurry, and a film substance to be polished are closely associated. In general, it is carried out while a polishing slurry is supplied to the contact interface between the polishing pad and the film substance to be polished. The polishing slurry is a composition comprising a component having electrical characteristics. The film substance to be polished may comprise a conductor or semiconductor film substance. The polishing pad has a predetermined chemical composition. In addition, they are physically close to each other during the semiconductor fabrication process. Thus, they have mutual electrical influences according to their respective material properties and their relative positions during the process.

In the electrical properties of the polishing pad, the polishing slurry, and the film substance to be polished, when the mutual attraction and repulsion are achieved at an appropriate level, defects on the film substance to be polished such as scratches and chatter marks can be minimized while the desired polishing performance in terms of polishing rate and flatness can be achieved. For example, if the electrical attraction between the polishing pad, the polishing slurry, and the film substance to be polished is too strong, the polishing particles in the polishing slurry may aggregate on the polishing pad, thereby causing defects such as scratches or chatter marks on the surface of the film substance to be polished. For example, if the electrical repulsion between the polishing pad, the polishing slurry, and the film substance to be polished is too strong, the polishing rate of the film substance to be polished may be lowered, thereby causing problems in terms of the process efficiency and polishing flatness. Thus, it is a very important factor to control the electrical properties between the polishing pad, the polishing slurry, and the film substance to be polished to an appropriate level.

Zeta potential generally refers to a physical property exhibited by particles in a suspension. There are two types of liquid layers that exist around particles: an inner region (stem layer: electron layer) in which ions form a strong boundary and an outer region (defuse) in which they are weakly bonded. The outer region (defuse) is a region within the theoretical boundary where ions and particles are stably present. For example, if the particles move, the ions in the inner region move within a certain boundary. On the other hand, the ions that exist outside a certain boundary move independently from the particles, like a huge dispersant. The potential at this boundary is the zeta potential. The polishing slurry has its own zeta potential as a suspension in which the polishing particles are dispersed.

Since the polishing pad is not in a suspension state as a cured resin, it does not have a zeta potential generally defined. In an embodiment, the surface zeta potential was devised as an index for representing the polishing performance of the polishing pad, and the surface zeta potential of the polishing pad may be defined by the above Relationship 1 in association with a standard composition in a suspension state having a certain zeta potential.

Hereinafter, the surface zeta potential of the polishing pad will be described in more detail with reference to FIG. 1.

FIG. 1 is a schematic diagram for illustrating the surface zeta potential of a polishing pad. Referring to FIG. 1, the polishing pad (100) may comprise a polishing layer (10). The polishing layer (10) may comprise a polishing surface (11) for polishing a film substance to be polished in direct or indirect contact therewith. The polishing pad (100) may be composed of a single layer of the polishing layer (10) or may have a multilayer structure comprising the polishing layer (10). Referring to FIG. 1, the polishing pad (100) according to an embodiment may comprise an adhesive layer (30) and a cushion layer (20) on one side of the polishing layer (10), but it is not limited thereto.

When a predetermined standard composition having its own zeta potential is supplied on the polishing surface (11) of the polishing pad (100), it has a fixed layer (110), an ion diffusion layer (120), and a slipping plane (130). The fixed layer (110) is a layer formed by the particles in the standard composition being stably present on the polishing surface (11). It is a region corresponding to an inner region (stem layer: electron layer) in a zeta potential generally defined for a suspension. The ion diffusion layer (120) is a region in which the particles in the standard composition are relatively weakly bonded to the polishing surface (11) as compared with the fixed layer (110). It is a region spaced apart by a certain distance from the polishing surface (11). The ion diffusion layer (120) is a region corresponding to an outer region (defuse) in a zeta potential generally defined for a suspension. The slipping plane (130) exists at the interface between the ion diffusion layer (120) and the fixed layer (110). The fixed layer (110) and the ion diffusion layer (120) are separated by this boundary. The slipping plane (130) is a region corresponding to a certain boundary in a zeta potential generally defined for a suspension.

In an embodiment, the surface zeta potential of the polishing pad according to Relationship 1 is defined as the sum of a negative (−) value of the zeta potential value of the fixed layer (110) and the zeta potential value of the corresponding standard composition. For example, as shown in FIG. 1, if the charge of the fixed layer (110) is positive (+), the polishing surface adjacent to the fixed layer (110) will have a negative (−) charge. Thus, in deriving the surface zeta potential of the polishing pad, a value obtained by applying (−) to the zeta potential value of the fixed layer (110) is used. When the change in the zeta potential with respect to the distance from the polishing surface for the particles in the standard composition is drawn as a graph, the zeta potential of the fixed layer (110) is defined as the value of the Y-intercept of the graph. The zeta potential of the particles is measured by electrophoretic mobility.

If the polishing pad satisfies a certain condition related to the surface zeta potential according to Relationship 1, that is, the condition according to Relationship 2, it is possible to achieve reliable polishing performance in terms of the interaction between the polishing pad, the polishing slurry to be used in the process using the polishing pad, and the film substance to be polished.

The first composition and the second composition are compositions whose hydrogen ion concentrations (pH) are different from each other. The surface zeta potential of the polishing surface for each composition is to be different from each other. That the ratio of the first surface zeta potential (PZ1) derived from the first composition and the second surface zeta potential (PZ2) derived from the second composition satisfies a predetermined range has a technical significance in that it enables polishing of film substances of different materials to be carried out simultaneously with excellent performance when the polishing pad is applied to an actual process.

Meanwhile, in another embodiment of the present invention, the polishing pad comprises a polishing layer, wherein when polishing is carried out using a first composition having a hydrogen ion concentration (pH) of 8 to 12, the polishing surface of the polishing layer has a first surface zeta potential (PZ1), which is a value of surface zeta potential of the polishing surface derived by the above Relationship 1 for the first composition; when polishing is carried out using a third composition having a hydrogen ion concentration (pH) of 7.5 to 9.5, the polishing surface of the polishing layer has a third surface zeta potential (PZ3), which is a value of surface zeta potential of the polishing surface derived by the above Relationship 1 for the third composition; and at least one of the first surface zeta potentials (PZ1) and at least one of the third surface zeta potentials (PZ3) satisfy the following Relationship 3:

$$1 \leq \frac{PZ1}{PZ3} \leq 5. \quad \text{[Relationship 3]}$$

The first composition and the third composition are compositions whose hydrogen ion concentrations (pH) are different from each other. The surface zeta potential of the polishing surface for each composition is to be different from each other. That the ratio of the first surface zeta potential (PZ1) derived from the first composition and the third surface zeta potential (PZ3) derived from the third composition satisfies a predetermined range means that it is possible to minimize such surface defects as scratches and chatter marks, while achieving excellent polishing performance, in various processes such as bulk and fine processes for an oxide layer with a single polishing pad, as well as to continuously or discontinuously apply a single polishing pad to the respective process steps in the above environments, when the polishing pad is applied to an actual process.

In still another embodiment of the present invention, the polishing pad comprises a polishing layer, wherein when polishing is carried out using a first composition having a hydrogen ion concentration (pH) of 8 to 12, specifically greater than 9.5 to 12, the polishing surface of the polishing layer has a first surface zeta potential (PZ1), which is a value of surface zeta potential of the polishing surface derived by the above Relationship 1 for the first composition; when polishing is carried out using a second composition having a hydrogen ion concentration (pH) of 2 to 6, the polishing surface of the polishing layer has a second surface zeta potential (PZ2), which is a value of surface zeta potential of the polishing surface derived by the above Relationship 1 for the second composition; when polishing is carried out using a third composition having a hydrogen ion concentration (pH) of 7.5 to 9.5, the polishing surface of the polishing layer has a third surface zeta potential (PZ3), which is a value of surface zeta potential of the polishing surface derived by the above Relationship 1 for the third composition; and at least one of the first surface zeta potentials (PZ1), at least one of the second surface zeta potentials (PZ2), and at least one of the third surface zeta potentials (PZ3) satisfy the following Relationship 4:

$$1.1 \leq \frac{PZ1 \times PZ2}{PZ3} \leq 50. \quad \text{[Relationship 4]}$$

The first composition, the second composition, and the third composition are compositions whose hydrogen ion concentrations (pH) are different from each other. The surface zeta potential of the polishing surface for each composition is to be different from each other. That the ratio (PZ1×PZ2/PZ3, Relationship 4) of the product (PZ1×PZ2) of the first surface zeta potential (PZ1) derived from the first composition and the second surface zeta potential (PZ2) derived from the second composition to the third surface zeta potential (PZ3) derived from the third composition satisfies a predetermined range means that it enables polishing using different types of polishing slurries to be carried out simultaneously with excellent performance when the polishing pad is applied to an actual process.

Specifically, the polishing pad satisfying Relationship 4 has advantages in that it is possible to achieve a range of excellent polishing performance in a polishing environment using different types of polishing slurries, specifically silica and ceria slurries, to minimize such surface defects as scratches and chatter marks, and to continuously or discontinuously apply a single polishing pad to the respective process steps that use silica and ceria slurries.

In still another embodiment of the present invention, the polishing pad comprises a polishing layer, wherein when polishing is carried out using a first composition having a hydrogen ion concentration (pH) of 8 to 12, specifically greater than 9.5 to 12, the polishing surface of the polishing layer has a first surface zeta potential (PZ1), which is a value of surface zeta potential of the polishing surface derived by the above Relationship 1 for the first composition; when polishing is carried out using a second composition having a hydrogen ion concentration (pH) of 2 to 6, the polishing surface of the polishing layer has a second surface zeta potential (PZ2), which is a value of surface zeta potential of the polishing surface derived by the above Relationship 1 for the second composition; when polishing is carried out using a third composition having a hydrogen ion concentration (pH) of 7.5 to 9.5, the polishing surface of the polishing layer has a third surface zeta potential (PZ3), which is a value of surface zeta potential of the polishing surface derived by the above Relationship 1 for the third composition; and at least one of the first surface zeta potentials (PZ1), at least one of the second surface zeta potentials (PZ2), and at least one of the third surface zeta potentials (PZ3) satisfy the following Relationship 5:

$$1 \leq \frac{(PZ2 - PZ1)}{(PZ2 - PZ3)} \leq 5. \quad \text{[Relationship 5]}$$

That the ratio ((PZ2−PZ1)/(PZ2−PZ3)) of the difference (PZ2−PZ1) between the second surface zeta potential (PZ2) derived from the second composition and the first surface zeta potential (PZ1) derived from the first composition to the difference (PZ2-PZ3) between the second surface zeta potential (PZ2) derived from the second composition and the third surface zeta potential (PZ3) derived from the third composition satisfies a predetermined range means that it enables polishing in an environment of different polishing slurries or using different types of polishing slurries to be carried out simultaneously with excellent performance when the polishing pad is applied to an actual process.

Specifically, the polishing pad satisfying Relationship 5 has advantages in that it is possible to achieve excellent polishing performance in different polishing environments, specifically acidic and basic polishing environments, or using silica and ceria slurries, to minimize such surface defects as scratches and chatter marks, and to continuously or discontinuously apply a single polishing pad to the respective process steps in the above environments.

If the polishing pad satisfies predetermined conditions related to the surface zeta potential according to Relationship 1, that is, the condition according to one or more of Relationships 2 to 5, it is possible to achieve reliable polishing performance in terms of the interaction between the polishing pad, the polishing slurry to be used in the process using the polishing pad, and the film substance to be polished.

In an embodiment, the first composition may have a hydrogen ion concentration (pH) of 8 to 12, for example, 9 to 12, for example, greater than 9.5 to 12, for example, 9 to 11, for example, 10 to 12, for example, 10 to 11.5, for example, 10.5 (=0.5).

In an embodiment, the second composition may have a pH of 2 to 6, for example, 2 to 5, for example, 3 to 6, for example, 3 to 5, for example, 4 (=0.5).

In an embodiment, the third composition may have a hydrogen ion concentration (pH) of 7.5 to 9.5, for example, 7.8 to 9.3, for example, 7.8 to 9, for example, 8.5 (+0.5).

The first composition and the third composition may be basic slurries, and the second composition may be an acidic slurry. Although the first composition and the third composition are basic slurries, the first composition comprises silica particles, and the third composition comprises ceria particles. They may differ from each other in a pH value by, for example, about 0.5 to 4.5, for example, about 0.5 to 4, for example, about 1 to 3.5, for example, about 1 to 3.

In the polishing pad according to an embodiment, the zeta potential of the fixed layer of Relationship 1 may vary depending on the chemical and physical properties of the polishing layer of the polishing pad and the type of the standard composition. When the first zeta potential of the fixed layer measured for the polishing surface of the polishing pad using the first composition is IZ1, when the second zeta potential of the fixed layer measured for the polishing surface of the polishing pad using the second composition is IZ2, and when the third zeta potential of the fixed layer measured for the polishing surface of the polishing pad using the third composition is IZ3, the zeta potential of the fixed layer for the first composition, IZ1, may be about +5 mV to about +30 mV, the zeta potential of the fixed layer for the second composition, IZ2, may be about −5 mV to about +15 mV, and the zeta potential of the fixed layer for the third composition, IZ3, may be about −15 mV to about +10 mV.

Specifically, the first zeta potential (IZ1) of the fixed layer may be about +5 mV to about +30 mV, for example, about +8 mV and about +28 mV, for example, about +10 m V to about +25 mV, for example, about +11 mV to about +23 mV, for example, about +15 mV to about +25 mV.

The second zeta potential (IZ2) of the fixed layer may be about −5 mV to about +15 mV, for example, about −2 mV and about +12 mV, for example, about −1 mV to about +8 mV, for example, about −0.7 mV to about +6 mV, for example, about −0.7 mV to about +4 mV.

The third zeta potential (IZ3) of the fixed layer may be about −15 mV to about +10 mV, for example, about −10 mV and about +8 mV, for example, about −10 mV to about +7 mV, for example, about −9 mV to about +6 mV, for example, about −8.8 mV to about +6 mV.

In an embodiment, the first composition may comprise silica particles having an average particle diameter of about 130 nm to about 160 nm and have a zeta potential of −50 mV to −30 mV, the second composition may comprise silica particles having an average particle diameter of about 30 nm to about 50 nm and have a zeta potential of +10 mV to +30 mV, and the third composition may comprise ceria particles having an average particle diameter of about 130 nm to about 170 nm, specifically, about 130 nm to about 160 nm, and have a zeta potential of −55 mV to −35 mV.

The zeta potential of each of the first composition, the second composition, and the third composition may be determined by its components and the contents thereof. Any three compositions containing the same components in the same contents would have the same zeta potential value. However, any three compositions having the same zeta potential value do not necessarily contain the same components in the same contents.

In an embodiment, the first composition may comprise fumed silica particles, the second composition may comprise colloidal silica particles, and the third composition may comprise ceria particles, for example, wet ceria particles.

In the polishing pad having a polishing surface whose surface zeta potentials for a first composition comprising fumed silica particles, a second composition comprising colloidal silica particles, and a third composition comprising ceria particles satisfy at least one of the above Relationships 2 to 5, while each of the compositions has the zeta potential as described above, there are advantages in that it is possible to achieve a range of excellent polishing performance in a polishing environment using different types of polishing slurries, to minimize such surface defects as scratches and chatter marks, to continuously or discontinuously apply a single polishing pad to the respective process steps in the above environments, and to secure excellent polishing performance for all film substances.

In an embodiment, the fumed silica particles may have an average particle diameter of 130 nm to 160 nm, for example, 140 nm to 160 nm, for example, 150 (+5) nm. In an embodiment, the colloidal silica particles may have an average particle diameter of 30 nm to 50 nm, for example, 30 nm to 45 nm, for example, 40 (+5) nm. In an embodiment, the ceria particles may have an average particle diameter of 130 nm to 170 nm, for example, 130 nm to 160 nm, for example, 140 nm to 160 nm, for example, 150 (+5) nm.

According to an embodiment of the present invention, the first composition may be a composition having its own zeta potential of −50 mV to −30 mV. The zeta potential of the first composition may be, for example, −50 mV to −35 mV, for example, −50 mV to −40 mV, for example, −48 mV to −35 mV, for example, −48 mV to −40 mV, for example, −47 mV to −35 mV, for example, −47 mV to −40 mV, for example, −46 mV to −38 mV, for example, −46 mV to −40 mV, for example, −45 mV to −38 mV, for example, −45 mV to −40 mV, for example, −44 mV to −38 mV, for example, −44 mV to −40 mV, for example, −43 mV to −38 mV, for example, −43 mV to −40 mV, for example, −42 mV to −38 mV, for example, −42 mV to −40 mV, for example, −42 mV to −41 mV.

The second composition may be a composition having its own zeta potential of +10 mV to +30 mV. The zeta potential of the second composition may be, for example, +15 mV to +30 mV, for example, +20 mV to +30 mV, for example, +20 mV to +28 mV, for example, +20 mV to +27 mV, for example, +20 mV to +26 mV, for example, +20 mV to +25 mV, for example, +20 mV to +24 mV, for example, +20 mV to +23 mV, for example, +21 mV to +23 mV.

The third composition may be a composition having its own zeta potential of −55 mV to −35 mV. The zeta potential of the third composition may be, for example, −50 mV to −35 mV, for example, −50 mV to −40 mV, for example, −50 mV to −43 mV, for example, −48 mV to −43 mV, for example, −47 mV to −43 mV, for example, −46 mV to −43 mV, for example, −46 mV to −44 mV.

In the polishing pad having a polishing surface whose surface zeta potentials for a first composition comprising fumed silica particles having the above average particle diameter and a second composition comprising colloidal silica particles having the above average particle diameter satisfy the condition of Relationship 2, while each of the compositions has the zeta potential as described above, there are advantages in that it is possible to secure excellent polishing performance for all film substances when the polishing process is continuously or discontinuously carried out for an object to be polished having film substances of different materials, specifically an object to be polished having an oxide layer and an object to be polished having a tungsten (W) layer.

In addition, in the polishing pad having a polishing surface whose surface zeta potentials for a first composition comprising fumed silica particles having the above average particle diameter and a third composition comprising ceria particles having the above average particle diameter satisfy the condition of Relationship 3, while each of the compositions has the zeta potential as described above, there are advantages in that it is possible to secure excellent polishing performance in both bulk and fine processes for an oxide layer when the bulk and fine processes are continuously or discontinuously carried out for an object to be polished having an oxide layer.

In addition, in the polishing pad having a polishing surface whose surface zeta potentials for a first composition comprising fumed silica particles having the above average particle diameter, a second composition comprising colloidal silica particles having the above average particle diameter, and a third composition comprising ceria particles having the above average particle diameter satisfy the condition of Relationship 4, while each of the compositions has the zeta potential as described above, there are advantages in that it is possible to secure excellent polishing performance for an oxide layer, a tungsten layer, or both without surface defects when the respective polishing processes using a silica slurry and a ceria slurry are continuously or discontinuously carried out.

In addition, in the polishing pad having a polishing surface whose surface zeta potentials for a first composition comprising fumed silica particles, a second composition comprising colloidal silica particles, and a third composition comprising ceria particles satisfy the condition of Relationship 5, while each of the compositions has the zeta potential as described above, there are advantages in that it is possible to achieve excellent polishing performance in different polishing environments, specifically, when the slurry environment is acidic and basic, or when a silica slurry and a ceria slurry are used, to minimize such surface defects as scratches and chatter marks, and to continuously or discontinuously apply a single polishing pad to the respective process steps in the above environments.

The zeta potentials of the first composition, the second composition, and the third composition each have a fixed value in one of the numerical ranges described above. As a result, the first surface zeta potential (PZ1), the second surface zeta potential (PZ2), and the third surface zeta potential (PZ3) derived by the first composition, the second composition, and the third composition each have a fixed value as well.

PZ1 may be, for example, −70 mV to −45 mV, for example, −70 mV to −48 mV, for example, −69 mV to −50 mV, for example, −68 mV to −50 mV, for example, −67 mV to −50 mV, for example, −66 mV to −51 mV, for example, −65 mV to −51 mV.

PZ2 may be, for example, +10 mV to +30 mV, for example, +12 mV to +28 mV, +14 mV to +26 mV, +15 mV to +26 mV, +16 mV to +26 mV, +16 mV to +25 mV, or +16 mV to +23 mV.

PZ3 may be, for example, −60 mV to −30 mV, for example, −58 mV to −30 mV, for example, −56 mV to −32 mV, for example, −55 mV to −32 mV, for example, −55 mV to −35 mV, for example, −54 mV to −35 mV, for example, −52 mV to −35 mV.

In the polishing pad according to an embodiment, as long as at least one PZ1 value and at least one PZ2 value satisfy the condition of Relationship 2, the advantages aimed at the present invention can be achieved even if another PZ1 value and another PZ2 value fail to satisfy the condition of Relationship 2. That is, the condition of Relationship 2 is that the ratio (PZ1/PZ2) of at least one of the first surface zeta potentials (PZ1) to at least one of the second surface zeta potentials (PZ2) of the polishing surface is in the range of −20 to 0. PZ1/PZ2 may be, for example, −10 to 0, for example, −5 to 0, for example, −4 to 0, for example, −3 to 0.

In the polishing pad according to another embodiment, as long as at least one PZ1 value and at least one PZ3 value satisfy the condition of Relationship 3, the advantages aimed at the present invention can be achieved even if another PZ1 value and another PZ3 value fail to satisfy the condition of Relationship 3. That is, the condition of Relationship 3 is that the ratio (PZ1/PZ3) of at least one of the first surface zeta potentials (PZ1) to at least one of the third surface zeta potentials (PZ3) of the polishing surface is in the range of 1 to 5. PZ1/PZ3 may be, for example, greater than 1 to 5, for example, greater than 1 to 3, for example, greater than 1 to 2, for example, 1.05 to 1.8, for example, 1.05 to 1.5.

In the polishing pad according to still another embodiment, as long as at least one of the first surface zeta potentials (PZ1), at least one of the second surface zeta potentials (PZ2), and at least one of the third surface zeta potentials (PZ3) satisfy the condition of Relationship 4, the advantages aimed at the present invention can be achieved even if another PZ1 value, another PZ2 value, and another PZ3 value fail to satisfy the condition of Relationship 4. That is, the condition of Relationship 4 is that the ratio (PZ1×PZ2/PZ3) of the product (PZ1×PZ2) of at least one of the first surface zeta potentials (PZ1) and at least one of the second surface zeta potentials (PZ2) to at least one of the third surface zeta potentials (PZ3) of the polishing surface is in the range of 1.1 to 50. PZ1×PZ2/PZ3 may be, for example, 5 to 50, for example, 10 to 50, for example, 15 to 40, for example, 17 to 35.

In PZ1×PZ2/PZ3, since PZ1 and PZ2 refer to the surface zeta potential values derived from the compositions (the first composition or the second composition) comprising silica particles of the same type (fumed silica particles or colloidal silica particles), and PZ3 refers to the surface zeta potential value derived from the composition comprising ceria particles, PZ1×PZ2/PZ3 may mean a ratio of a surface zeta potential value derived from a composition comprising silica particles to a surface zeta potential value derived from a composition comprising ceria particles. The polishing pad having a polishing surface satisfying Relationship 4 has advantages in that it is possible to achieve a range of excellent polishing performance in a polishing environment using different types of polishing slurries, specifically silica and ceria slurries, to minimize such surface defects as scratches and chatter marks, and to continuously or discontinuously apply a single polishing pad to the respective process steps that use silica and ceria slurries.

In the polishing pad according to still another embodiment, as long as at least one of the first surface zeta potentials (PZ1), at least one of the second surface zeta potentials (PZ2), and at least one of the third surface zeta potentials (PZ3) satisfy the condition of Relationship 5, the advantages aimed at the present invention can be achieved even if another PZ1 value, another PZ2 value, and another PZ3 value fail to satisfy the condition of Relationship 5. That is, the condition of Relationship 5 is that the ratio ((PZ2−PZ1)/(PZ2−PZ3)) of the difference (PZ2−PZ1) between at least one of the second surface zeta potentials (PZ2) and at least one of the first surface zeta potentials (PZ1) to the difference (PZ2−PZ3) between at least one of the second surface zeta potentials (PZ2) and at least one of the third surface zeta potentials (PZ3) of the polishing surface is in the range of 1 to 5. (PZ2−PZ1)/(PZ2−PZ3) may be, for example, greater than 1 to 5, for example, 1.02 to 4, for example, 1.02 to 3, for example, 1.02 to 2.

Meanwhile, the difference (PZ2−PZ1) between at least one of the second surface zeta potentials (PZ2) and at least one of the first surface zeta potentials (PZ1) may be 50 mV to 100 mV. PZ2−PZ1 may be, for example, 60 mV to 100 mV, for example, 65 mV to 100 mV, for example, 65 mV to 95 mV, or, for example, 65 mV to 90 mV.

The difference (PZ2−PZ3) between at least one of the second surface zeta potentials (PZ2) and at least one of the third surface zeta potentials (PZ3) may be 40 mV to 80 mV. PZ2−PZ3 may be, for example, 45 mV to 75 mV, for example, 50 mV to 75 mV, for example, 55 mV to 75 mV, or, for example, 64 mV to 75 mV.

As PZ2−PZ1 and PZ2−PZ3 satisfy the above ranges, it enables polishing in an environment of different compositions (polishing slurries) or using different types of polishing slurries to be carried out simultaneously with excellent performance when the polishing pad is applied to an actual process, and it is possible to improve surface defects such as scratches and chatter marks appearing on an oxide layer or a tungsten layer.

In an embodiment, the polishing pad may have a polishing rate (OR1) of 2,750 Å/min to less than 2,955 Å/min for the polishing surface thereof when an oxide layer is polished using the first composition. OR1 may be, for example, 2,780 Å/min to less than 2,955 Å/min, for example, 2,800 Å/min to less than 2,955 Å/min, for example, 2,850 Å/min to 2,952 Å/min, for example, 2,890 Å/min to 2,950 Å/min, for example, greater than 2,900 Å/min to 2,950 Å/min, for example, 2,920 Å/min to 2,950 Å/min.

The polishing pad may have a polishing rate (WR2) of 730 Å/min to 850 Å/min for the polishing surface thereof when a tungsten layer is polished using the second composition. WR2 may be, for example, 730 Å/min to 830 Å/min, for example, 770 Å/min to 820 Å/min, for example, 780 Å/min to 800 Å/min, for example, 783 Å/min to 800 Å/min.

The polishing pad may have a polishing rate (OR3) of 2,200 Å/min to 2,955 Å/min for the polishing surface thereof when an oxide layer is polished using the third composition. OR3 may be, for example, 2,200 Å/min to 2,800 Å/min, for example, 2,200 Å/min to 2,700 Å/min, for example, 2,200 Å/min to 2,600 Å/min, for example, 2,300 Å/min to 2,600 Å/min.

In an embodiment, the polishing pad may have a ratio (OR1/WR2) of OR1 to WR2 of 3.0 to 4.5, for example, 3.2 to 4.2, for example, 3.5 to 4.0, for example, 3.6 to 3.8, for example, 3.65 to 3.78.

OR1 and WR2 may be indirect indicators for determining whether a factor for the polishing performance, in particular, the polishing rate of the polishing pad for an oxide layer and a tungsten (W) layer is achieved at a desired level. The polishing performance may be evaluated by comprehensively considering various factors such as polishing selectivity and structural defects as well as polishing rate. As the polishing pad according to an embodiment has a polishing surface that satisfies the requirements on OR1 and WR2, it is possible to achieve an appropriate polishing rate and, at the same time, to achieve the advantage of minimizing structural defects such as dishing, scratches, and chatter marks.

In another embodiment, the polishing pad may have a ratio (OR1/OR3) of OR1 to OR3 of 1.0 to 1.5, for example, 1.1 to 1.4, for example, 1.12 to 1.30, for example, 1.12 to 1.17, for example, 1.24 to 1.30.

OR1 and OR3 may be indirect indicators for determining whether a factor for the polishing rate of the polishing pad is achieved at a desired level in various processes such as bulk and fine processes for an oxide layer with the polishing pad using a silica polishing slurry and/or a ceria polishing slurry. The polishing performance may be evaluated by comprehensively considering various factors such as polishing selectivity and structural defects as well as polishing rate. As the polishing pad according to an embodiment has a polishing surface that satisfies the requirements on OR1 and OR3, it is possible to achieve an appropriate polishing rate and, at the same time, to achieve the advantage of minimizing structural defects such as dishing, scratches, and chatter marks.

In still another embodiment, the ratio of the product (OR1×WR2/OR3) of OR1 and WR2 to OR3 may be 800 to 1,300, for example, 850 to 1,250, for example, 890 to 1,200, for example, 890 to 1,020, or, for example, 930 to 1,020.

OR1, WR2, and OR3 may be indirect indicators for determining whether a factor for the polishing performance, in particular, the polishing rate of the polishing pad for an oxide layer and a tungsten (W) layer is achieved at a desired level. The polishing performance may be evaluated by comprehensively considering various factors such as polishing selectivity and structural defects as well as polishing rate. As the polishing pad according to an embodiment has a polishing surface that satisfies the requirements on OR1, WR2, and OR3, it is possible to achieve an appropriate polishing rate and, at the same time, to achieve the advantage of minimizing structural defects such as dishing, scratches, and chatter marks.

In still another embodiment, the ratio ((WR2−OR1)/(WR2−OR3)) of the difference between WR2 and OR1 (WR2−OR1) to the difference between WR2 and OR3 (WR2−OR3) may be 1 to 2, for example, 1 to 1.8, for example, 1 to 1.6, for example, 1 to 1.5, or, for example, 1.1 to 1.5.

OR1, WR2, and OR3 may be indirect indicators for determining whether a factor for the polishing performance, in particular, the polishing rate of the polishing pad for an oxide layer and a tungsten (W) layer is achieved at a desired level. The polishing performance may be evaluated by comprehensively considering various factors such as polishing selectivity and structural defects as well as polishing rate. As the polishing pad according to an embodiment has a polishing surface that satisfies the requirements on OR1, WR2, and OR3, it is possible to achieve an appropriate polishing rate and, at the same time, to achieve the advantage of minimizing structural defects such as dishing, scratches, and chatter marks.

In an embodiment, the polishing layer may have a porous structure comprising a plurality of pores. Specifically, the number average diameter of the plurality of pores contained in the polishing layer may be about 10 μm to about 40 μm, for example, about μm to about 35 μm, for example, about 12 μm to about 30 μm, for example, about 14 μm to about 30 μm, for example, about 16 μm to about 30 μm, for example, about 14 μm to about 28 μm, for example, about 16 μm to about 28 μm. The number average diameter of the pores may be defined as an average value obtained by dividing the sum of the diameters of the plurality of pores by the number of the pores.

In an embodiment, the polishing pad may comprise a polishing layer comprising a cured product formed from a composition comprising a urethane-based prepolymer, a curing agent, and a foaming agent.

Each component contained in the composition will be described below in detail.

A "prepolymer" generally refers to a polymer having a relatively low molecular weight wherein the degree of polymerization is adjusted to an intermediate level so as to conveniently mold a molded article in the process of producing a cured product. A prepolymer may be molded to a final cured product by itself or after a reaction with another polymerizable compound.

In an embodiment, the urethane-based prepolymer may be prepared by reacting an isocyanate compound with a polyol.

The isocyanate compound used in the preparation of the urethane-based prepolymer may be one selected from the group consisting of an aromatic diisocyanate, an aliphatic diisocyanate, an alicyclic diisocyanate, or combinations thereof.

The isocyanate compound, for example, may comprise one selected from the group consisting of 2,4-toluene diisocyanate (2,4-TDI), 2,6-toluene diisocyanate (2,6-TDI), naphthalene-1,5-diisocyanate, p-phenylene diisocyanate, tolidine diisocyanate, 4,4'-diphenylmethane diisocyanate, hexamethylene diisocyanate, dicyclohexylmethane diisocyanate, isophorone diisocyanate, and combinations thereof.

The polyol is a compound containing at least two or more hydroxyl groups (—OH) per molecule. For example, it may comprise one selected from the group consisting of a polyether polyol, a polyester polyol, a polycarbonate polyol, an acryl polyol, and combinations thereof.

The polyol, for example, may comprise one selected from the group consisting of polytetramethylene ether glycol, polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol, and combinations thereof.

The polyol may have a weight average molecular weight (Mw) of 100 g/mole to 3,000 g/mole. The polyol, for example, may have a weight average molecular weight (Mw) of about 100 g/mole to about 3,000 g/mole, for example, about 100 g/mole to about 2,000 g/mole, for example, about 100 g/mole to about 1,800 g/mole.

In an embodiment, the polyol may comprise a low molecular weight polyol having a weight average molecular weight (Mw) of about 100 g/mole to less than about 300 g/mole and a high molecular weight polyol having a weight average molecular weight (Mw) of about 300 g/mole to about 1,800 g/mole.

The urethane-based prepolymer may have a weight average molecular weight (Mw) of 500 g/mole to 3,000 g/mole. The urethane-based prepolymer may have a weight average molecular weight (Mw) of, for example, about 1,000 g/mole to about 2,000 g/mole, for example, about 1,000 g/mole to about 1,500 g/mole.

In an embodiment, the isocyanate compound for the preparation of the urethane-based prepolymer may comprise an aromatic diisocyanate compound, and the aromatic diisocyanate compound, for example, may comprise 2,4-toluene diisocyanate (2,4-TDI) and 2,6-toluene diisocyanate (2,6-TDI). The polyol compound for the preparation of the urethane-based prepolymer may comprise polytetramethylene ether glycol (PTMEG) and diethylene glycol (DEG).

In another embodiment, the isocyanate compound for the preparation of the urethane-based prepolymer may comprise an aromatic diisocyanate compound and an alicyclic diisocyanate compound. For example, the aromatic diisocyanate compound may comprise 2,4-toluene diisocyanate (2,4-TDI) and 2,6-toluene diisocyanate (2,6-TDI), and the alicyclic diisocyanate compound may comprise dicyclohexylmethane diisocyanate (H12MDI). The polyol compound for the preparation of the urethane-based prepolymer may comprise polytetramethylene ether glycol (PTMEG) and diethylene glycol (DEG).

The urethane-based prepolymer may have an isocyanate end group content (NCO %) of about 5% by weight to about 11% by weight, for example, about 5% by weight to about 10% by weight, for example, about 5% by weight to about 8% by weight, for example, about 8% by weight to about 10% by weight.

The isocyanate end group content (NCO %) of the urethane-based prepolymer may be designed by comprehensively adjusting the type and content of the isocyanate compound and the polyol compound for the preparation of the urethane-based prepolymer, the process conditions such as temperature, pressure, and time in the process for preparing the urethane-based prepolymer, and the type and content of the additives used in the preparation of the urethane-based prepolymer.

If the NCO % of the urethane-based prepolymer satisfies the above range, the reaction rate, reaction time, and final curing structure in the subsequent reaction between the urethane-based prepolymer and a curing agent can be adjusted in a way favorable to the polishing performance from the viewpoint of the use and purpose of the final polishing pad.

In an embodiment, the urethane-based prepolymer may have an isocyanate end group content (NCO %) of about 8% by weight to about 10% by weight, for example, about 8% by weight to about 9.4% by weight. If the NCO % of the urethane-based prepolymer is less than the above range, the first surface zeta potential, the second surface zeta potential, and the third surface zeta potential as electrical properties based on the chemically hardened structure in the polishing pad may be achieved such that the desired polishing performance in terms of polishing rate and flatness are not achieved, and there may be a problem in that the lifespan of the polishing pad is reduced due to an excessive increase in the cut pad rate. On the other hand, if the NCO % exceeds the above range, surface defects such as scratches and chatter marks on the semiconductor substrate may increase.

The curing agent is a compound for chemically reacting with the urethane-based prepolymer to form a final cured structure in the polishing layer. For example, it may comprise an amine compound or an alcohol compound. Specifically, the curing agent may comprise one selected from the group consisting of an aromatic amine, an aliphatic amine, an aromatic alcohol, an aliphatic alcohol, and combinations thereof.

For example, the curing agent may comprise one selected from the group consisting of 4,4'-methylenebis(2-chloroaniline) (MOCA), diethyltoluenediamine (DETDA), diaminodiphenylmethane, dimethyl thio-toluene diamine (DMTDA), propanediol bis-p-aminobenzoate, methylene bis-methylanthranilate, diaminodiphenyl sulphone, m-xylenediamine, isophoronediamine, ethylenediamine, diethylenetriamine, triethylenetetramine, polypropylenediamine, polypropylenetriamine, bis(4-amino-3-chlorophenyl) methane, and combinations thereof.

The content of the curing agent may be about 18 parts by weight to about 27 parts by weight, for example, about 19 parts by weight to about 26 parts by weight, for example, about 20 parts by weight to about 26 parts by weight, based on 100 parts by weight of the urethane-based prepolymer. If the content of the curing agent satisfies the above range, it may be more advantageous for achieving a desired surface zeta potential ratio of the polishing pad.

In an embodiment, the curing agent may comprise 4,4'-methylenebis(2-chloroaniline) or dimethylthiotoluenediamine. The content of the curing agent may be about 21 parts by weight to about 26 parts by weight based on 100 parts by weight of the urethane-based prepolymer. Through this, the cured structure of urethane in the polishing layer may give rise to the electrical properties based on the chemical features according to the reaction between the urethane-based prepolymer and the curing agent. Such electrical properties may be advantageous for achieving the polishing performance of the polishing pad within a desired range.

The foaming agent is a component for forming a pore structure in the polishing layer. It may comprise one selected from the group consisting of a solid phase foaming agent, a gas phase foaming agent, a liquid phase foaming agent, and combinations thereof. In an embodiment, the foaming agent may comprise a solid phase foaming agent, a gas phase foaming agent, and a combination thereof.

The solid phase foaming agent may have an average particle diameter of about 5 μm to about 200 μm, for example, about 20 μm to about 50 μm, for example, about 21 μm to about 50 μm, for example, about 25 μm to about 45 μm. The average particle diameter of the solid foaming agent may refer to the average particle diameter of thermally expanded particles when the solid phase foaming agent is thermally expanded particles as described below and to the average particle diameter of particles after they are expanded by heat or pressure when the solid phase foaming agent is unexpanded particles as described below.

The solid phase foaming agent may comprise expandable particles. The expandable particles are particles having a characteristic that can be expanded by heat or pressure. The size in the final polishing layer may be determined by heat or pressure applied in the process of preparing the polishing layer. The expandable particles may comprise thermally expanded particles, unexpanded particles, or a combination thereof. The thermally expanded particles are particles previously expanded by heat. They refer to particles having little or no change in size by heat or pressure applied during the process of preparing the polishing layer. The unexpanded particles are particles that have not been previously expanded by heat. They refer to particles whose final size is determined when expanded by heat or pressure applied during the process of preparing the polishing layer.

The expandable particles may comprise a shell of a resin; and an expansion-inducing component encapsulated inside the shell.

For example, the shell may comprise a thermoplastic resin. The thermoplastic resin may be at least one selected from the group consisting of a vinylidene chloride-based copolymer, an acrylonitrile-based copolymer, a methacrylonitrile-based copolymer, and an acrylic-based copolymer.

The expansion-inducing component may comprise one selected from the group consisting of a hydrocarbon compound, a chlorofluoro compound, a tetraalkylsilane compound, and combinations thereof.

Specifically, the hydrocarbon may comprise one selected from the group consisting of ethane, ethylene, propane, propene, n-butane, isobutane, n-butene, isobutene, n-pentane, isopentane, neopentane, n-hexane, heptane, petroleum ether, and combinations thereof.

The chlorofluoro compound may comprise one selected from the group consisting of trichlorofluoromethane ($CCl_3F$), dichlorodifluoromethane ($CCl_2F_2$), chlorotrifluoromethane (chlorotrifluoromethane, $CClF_3$), tetrafluoroethylene (tetrafluoroethylene, $CClF_2$—$CClF_2$), and combinations thereof.

The tetraalkylsilane compound may comprise one selected from the group consisting of tetramethylsilane, trimethylethylsilane, trimethylisopropylsilane, trimethyl-n-propylsilane, and combinations thereof.

The solid phase foaming agent may optionally comprise particles treated with an inorganic component. For example, the solid phase foaming agent may comprise expandable particles treated with an inorganic component. In an embodiment, the solid phase foaming agent may comprise expandable particles treated with silica ($SiO_2$) particles. The treatment of the solid phase foaming agent with an inorganic component can prevent aggregation between a plurality of particles. The solid phase foaming agent treated with an inorganic component may be different from the solid phase foaming agent that is not treated with an inorganic component in terms of the chemical, electrical, and/or physical properties of the surface of the foaming agent.

The content of the solid phase foaming agent may be about 0.5 part by weight to about 10 parts by weight, for example, about 1 part by weight to about 3 parts by weight, for example, about 1.3 parts by weight to about 2.7 parts by weight, for example, about 1.3 parts by weight to about 2.6 parts by weight, based on 100 parts by weight of the urethane-based prepolymer.

The type and content of the solid phase foaming agent may be designed according to the desired pore structure and physical properties of the polishing layer.

The gas phase foaming agent may comprise an inert gas. The gas phase foaming agent is fed while the urethane-based prepolymer and the curing agent are reacted in order to be used as a component to form pores.

The kind of the inert gas is not particularly limited as long as it is a gas that does not participate in the reaction between the urethane-based prepolymer and the curing agent. For example, the inert gas may comprise one selected from the group consisting of nitrogen gas ($N_2$), argon gas (Ar), helium gas (He), and combinations thereof. Specifically, the inert gas may comprise nitrogen gas ($N_2$) or argon gas (Ar).

The type and content of the gas phase foaming agent may be designed according to the desired pore structure and physical properties of the polishing layer.

In an embodiment, the foaming agent may comprise a solid phase foaming agent. For example, the foaming agent may be composed of a solid phase foaming agent alone.

The solid phase foaming agent may comprise expandable particles, and the expandable particles may comprise thermally expanded particles. For example, the solid phase foaming agent may be composed of thermally expanded particles alone. If it is composed of thermally expanded particles alone without unexpanded particles, the variability of the pore structure is lowered, whereas the predictability is increased, so that it may be advantageous for achieving homogeneous pore characteristics over the entire area of the polishing layer.

In an embodiment, the thermally expanded particles may be particles having an average particle diameter of about 5 µm to about 200 µm. The average particle diameter of the thermally expanded particles may be about 5 µm to about 100 µm, for example, about 10 µm to about 80 µm, for example, about 20 µm to about 70 µm, for example, about 20 µm to about 50 µm, for example, about 30 µm to about 70 µm, for example, about 25 µm to 45 µm, for example, about 40 µm to about 70 µm, for example, about 40 µm to about 60 µm. The average particle diameter is defined as the D50 of the thermally expanded particles.

In an embodiment, the thermally expanded particles may have a density of about 30 kg/m$^3$ to about 80 kg/m$^3$, for example, about 35 kg/m$^3$ to about 80 kg/m$^3$, for example, about 35 kg/m$^3$ to about 75 kg/m$^3$, for example, about 38 kg/m$^3$ to about 72 kg/m$^3$, for example, about 40 kg/m$^3$ to about 75 kg/m$^3$, for example, about 40 kg/m$^3$ to about 72 kg/m$^3$.

In an embodiment, the solid phase foaming agent may comprise expandable particles that are not treated with an inorganic component. For example, the solid phase foaming agent may be composed of expandable particles that are not treated with an inorganic component. As the expandable particles that are not treated with an inorganic component are used as the solid phase foaming agent, the chemical and electrical properties of the surface of the solid phase foaming agent may be advantageous for achieving desired surface zeta potential characteristics.

In an embodiment, the foaming agent may comprise a gas phase foaming agent. For example, the foaming agent may comprise a solid phase foaming agent and a gas phase foaming agent. Details on the solid phase foaming agent are as described above.

The gas phase foaming agent may comprise nitrogen gas.

The gas phase foaming agent may be fed through a predetermined feeding line while the urethane-based prepolymer, the solid phase foaming agent, and the curing agent are mixed. The feeding rate of the gas phase foaming agent is about 0.8 liter/min to about 2.0 liters/min, for example, about 0.8 liter/min to about 1.8 liters/min, for example, about 0.8 liter/min to about 1.7 liters/min, for example, about 1.0 liter/min to about 2.0 liters/min, for example, about 1.0 liter/min to about 1.8 liters/min, for example, about 1.0 liter/min to about 1.7/min.

The composition for preparing a polishing layer may further comprise other additives such as a surfactant and a reaction rate controlling agent. The names such as "surfactant" and "reaction rate controlling agent" are arbitrary names based on the main role of the substances. The respective substances do not necessarily perform only a function limited to the role defined by the names.

The surfactant is not particularly limited as long as it acts to prevent pores from coalescing and overlapping with each other. For example, the surfactant may comprise a silicone-based surfactant.

The surfactant may be employed in an amount of about 0.2 part by weight to about 2 parts by weight based on 100 parts by weight of the urethane-based prepolymer. Specifically, the surfactant may be employed in an amount of about 0.2 part by weight to about 1.9 parts by weight, for example, about 0.2 part by weight to about 1.8 parts by weight, for example, about 0.2 part by weight to about 1.7 parts by weight, for example, about 0.2 part by weight to about 1.6 parts by weight, for example, about 0.2 part by weight to about 1.5 parts, for example, 0.5 part by weight to 1.5 parts by weight, based on 100 parts by weight of the urethane-based prepolymer. If the amount of the surfactant is within the above range, pores derived from the gas phase foaming agent can be stably formed and maintained in the mold.

The reaction rate controlling agent serves to promote or retard the reaction. A reaction promoter, a reaction retarder, or both may be used depending on the purpose. The reaction rate controlling agent may comprise a reaction promoter. For example, the reaction rate controlling agent may be at least one reaction promoter selected from the group consisting of a tertiary amine-based compound and an organometallic compound.

Specifically, the reaction rate controlling agent may comprise at least one selected from the group consisting of tricthylenediamine, dimethylethanolamine, tetramethylbutanediamine, 2-methyl-triethylenediamine, dimethylcyclohexylamine, triethylamine, triisopropanolamine, 1,4-diazabicyclo(2,2,2) octane, bis(2-methylaminoethyl) ether, trimethylaminoethylethanolamine, N,N,N,N,N"-pentamethyldiethylenetriamine, dimethylaminoethylamine, dimethylaminopropylamine, benzyldimethylamine, N-ethylmorpholine, N,N-dimethylaminoethylmorpholine, N,N-dimethylcyclohexylamine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controlling agent may comprise at least one selected from the group consisting of benzyldimethylamine, N,N-dimethylcyclohexylamine, and triethylamine.

The reaction rate controlling agent may be employed in an amount of about 0.05 part by weight to about 2 parts by weight based on 100 parts by weight of the urethane-based prepolymer. Specifically, the reaction rate controlling agent may be employed in an amount of about 0.05 part by weight to about 1.8 parts by weight, for example, about 0.05 part by weight to about 1.7 parts by weight, for example, about 0.05 part by weight to about 1.6 parts by weight, for example, about 0.1 part by weight to about 1.5 parts by weight, for example, about 0.1 part by weight to about 0.3 part by weight, for example, about 0.2 part by weight to about 1.8 parts by weight, for example, about 0.2 part by weight to about 1.7 parts by weight, for example, about 0.2 part by weight to about 1.6 parts by weight, for example, about 0.2 part by weight to about 1.5 parts by weight, for example, about 0.5 part by weight to about 1 part by weight, based on 100 parts by weight of the urethane-based prepolymer. If the reaction rate controlling agent is used in the above content range, the curing reaction rate of the prepolymer composition may be appropriately controlled to form a polishing layer having pores of a desired size and hardness.

In an embodiment, the content of an inorganic substance in the polishing layer may be about 5 ppm to about 500 ppm.

The inorganic substance, for example, may comprise at least one element selected from the group consisting of a silicon (Si) element, a phosphorus (P) element, and a calcium (Ca) element.

The inorganic substance may be derived from various sources. For example, the inorganic substance may be derived from various additives such as a foaming agent used in the preparation of the polishing layer. Here, the additive serving as the source of the inorganic substance, for example, may include one selected from the group consisting of a foaming agent, a surfactant, a reaction rate controlling agent, and a combination thereof.

The content of an inorganic substance in the polishing layer may be designed in an appropriate range by using only one of a foaming agent and an additional additive and adjusting the type and content thereof or may be designed in an appropriate range by using both of a foaming agent and an additional additive and adjusting the type and content thereof.

The content of an inorganic substance in the polishing layer may be about 5 ppm to about 500 ppm, for example, about 5 ppm to about 400 ppm, for example, about 8 ppm to about 300 ppm, for example, about 220 ppm to about 400 ppm, for example, about 5 ppm to about 180 ppm. In such event, the content of an inorganic substance in the polishing layer may be measured by inductively coupled plasma atomic emission spectrometer (ICP) analysis.

The content of an inorganic substance in the polishing layer may have a significant impact on the surface zeta potential of the polishing pad. If the content of an inorganic substance satisfies the above range, a desired surface zeta potential of the polishing pad, specifically, a ratio of the surface zeta potential of the polishing pad according to the type of polishing slurry may be achieved within a predetermined range. If the content of an inorganic substance in the polishing layer exceeds about 500 ppm, the composition of the polishing layer may be changed so that the surface zeta potential of the polishing pad may vary. In such event, the electrical correlation between the polishing layer and the polishing slurry in the process of preparing a semiconductor device may be changed in a direction to significantly increase surface defects such as scratches and chatter marks on the semiconductor substrate.

Hereinafter, the process for preparing a polishing pad will be described in detail.

In another embodiment according to the present invention, there is provided a process for preparing a polishing pad, which comprises preparing a prepolymer composition; preparing a composition for preparing a polishing layer comprising the prepolymer composition, a foaming agent, and a curing agent; and curing the composition for preparing a polishing layer to prepare a polishing layer.

The step of preparing a prepolymer composition may be a step of reacting a diisocyanate compound and a polyol compound to prepare a urethane-based prepolymer. Details on the diisocyanate compound and the polyol compound are described above with respect to the polishing pad.

The prepolymer composition may have a content of isocyanate groups (NCO groups) of about 5% by weight to about 15% by weight, for example, about 5% by weight to about 8% by weight, for example, about 5% by weight to about 7% by weight, for example, about 8% by weight to about 15% by weight, for example, about 8% by weight to about 14% by weight, for example, about 8% by weight to about 12% by weight, for example, about 8% by weight to about 10% by weight.

The content of isocyanate groups in the prepolymer composition may be derived from terminal isocyanate groups of the urethane-based prepolymer, unreacted isocyanate groups in the diisocyanate compound, and the like.

The prepolymer composition may have a viscosity of about 100 cps to about 1,000 cps, for example, about 200 cps to about 800 cps, for example, about 200 cps to about 600 cps, for example, about 200 cps to about 550 cps, for example, about 300 cps to about 500 cps at about 80° C.

The foaming agent may comprise a solid phase foaming agent or a gas phase foaming agent.

If the foaming agent comprises a solid phase foaming agent, the step of preparing a composition for preparing a polishing layer may comprise mixing the prepolymer composition and the solid phase foaming agent to prepare a first preliminary composition; and mixing the first preliminary composition and a curing agent to prepare a second preliminary composition.

The first preliminary composition may have a viscosity of about 1,000 cps to about 2,000 cps, for example, about 1,000 cps to about 1,800 cps, for example, about 1,000 cps to about 1,600 cps, for example, about 1,000 cps to about 1,500 cps at about 80° C.

If the foaming agent comprises a gas phase foaming agent, the step of preparing a composition for preparing a polishing layer may comprise preparing a third preliminary composition comprising the prepolymer composition and the curing agent; and feeding the gas phase foaming agent to the third preliminary composition to prepare a fourth preliminary composition.

In an embodiment, the third preliminary composition may further comprise a solid phase foaming agent.

In an embodiment, the step of preparing a polishing layer comprises preparing a mold preheated to a first temperature; and injecting the composition for preparing a polishing layer into the preheated mold and curing it; and post-curing the cured composition for preparing a polishing layer under a second temperature condition higher than the preheating temperature.

In an embodiment, the temperature difference between the first temperature and the second temperature may be about 10° C. to about 40° C., for example, about 10° C. to about 35° C., for example, about 15° C. to about 35° C.

In an embodiment, the first temperature may be about 60° C. to about 100° C., for example, about 65° C. to about 95° C., for example, about 70° C. to about 90° C.

In an embodiment, the second temperature may be about 100° C. to about 130° C., for example, about 100° C. to about 125° C., for example, about 100° C. to about 120° C.

The step of curing the composition for preparing a polishing layer at the first temperature may be carried out for about 5 minutes to about 60 minutes, for example, about 5 minutes to about 40 minutes, for example, about 5 minutes to about 30 minutes, for example, about 5 minutes to about 25 minutes.

The step of post-curing the composition for preparing a polishing layer cured at the first temperature at the second temperature may be carried out for about 5 hours to about 30 hours, for example, about 5 hours to about 25 hours, for example, about 10 hours to about 30 hours, for example, about 10 hours to about 25 hours, for example, about 12 hours to about 24 hours, for example, about 15 hours to about 24 hours.

The process for preparing a polishing pad may further comprise machining at least one side of the polishing layer.

The step of machining at least one side of the polishing layer may comprise (1) forming grooves on at least one side of the polishing layer; (2) line turning at least one side of the polishing layer; and (3) roughening at least one side of the polishing layer.

In step (1), the grooves may comprise at least one of concentric circular grooves spaced apart from the center of the polishing layer at a certain interval; and radial grooves continuously connected from the center of the polishing layer to the edge of the polishing layer.

In step (2), the line turning may be carried out by cutting the polishing layer in a certain thickness using a cutting tool.

In step (3), the roughening may be carried out by machining the surface of the polishing layer with a sanding roller.

The process for preparing a polishing pad may further comprise laminating a cushion layer on the side of the polishing layer opposite to the polishing surface.

The polishing layer and the cushion layer may be laminated using a heat-sealing adhesive.

The heat-sealing adhesive is applied on the side of the polishing layer opposite to the polishing surface, the heat-sealing adhesive is applied on the surface of the cushion layer to be in contact with the polishing layer, the polishing layer and the cushion layer are laminated such that the sides to which the heat-sealing adhesive has been applied are in contact, and the two layers may be fused using a pressure roller.

The cushion layer serves to support the polishing layer and to absorb and disperse an impact applied to the polishing layer. Thus, it is possible to minimize damage and defects to the object to be polished during the polishing process using the polishing pad.

The cushion layer may comprise a nonwoven fabric or a suede, but it is not limited thereto.

In an embodiment, the cushion layer may be a resin-impregnated nonwoven fabric. The nonwoven fabric may be a fibrous nonwoven fabric comprising one selected from the group consisting of a polyester fiber, a polyamide fiber, a polypropylene fiber, a polyethylene fiber, and combinations thereof.

The resin impregnated in the nonwoven fabric may comprise a polyurethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicone rubber resin, a polyester-based elastomer resin, a polyamide-based elastomer resin, and combinations thereof.

In still another embodiment according to the present invention, there is provided a process for preparing a semiconductor device, which comprises providing a polishing pad comprising a polishing layer; and relatively rotating the polishing surface of the polishing layer and the surface of an object to be polished while they are in contact with each other to polish the object to be polished, wherein the object to be polished comprises an oxide layer, a tungsten layer, or a composite layer thereof, and when polishing is carried out using a first composition having a hydrogen ion concentration (pH) of 8 to 12, the polishing surface of the polishing layer has a first surface zeta potential (PZ1), which is a value of surface zeta potential of the polishing surface derived by the following Relationship 1 for the first composition; when polishing is carried out using a second composition having a hydrogen ion concentration (pH) of 2 to 6, the polishing surface of the polishing layer has a second surface zeta potential (PZ2), which is a value of surface zeta potential of the polishing surface derived by the following Relationship 1 for the second composition; and at least one of the first surface zeta potentials (PZ1) and at least one of the second surface zeta potentials (PZ2) satisfy the following Relationship 2.

Surface zeta potential=(−) zeta potential of the fixed layer+zeta potential of the composition [Relationship 1]

$$-20 \leq \frac{PZ1}{PZ2} \leq 0. \quad \text{[Relationship 2]}$$

FIG. 4 schematically illustrates a process for preparing a semiconductor device according to an embodiment. Referring to FIG. 4, once the polishing pad (410) according to an embodiment is attached to a platen (420), a semiconductor substrate (430) as an object to be polished is disposed on the polishing pad (410). In such event, the surface to be polished of the semiconductor substrate (430) is in direct contact with the polishing surface of the polishing pad (410). A polishing slurry (450) may be sprayed through a nozzle (440) on the polishing pad for polishing. The flow rate of the polishing slurry (450) supplied through the nozzle (440) may be selected according to the purpose within a range of about 10 cm³/minute to about 1,000 cm³/minute. For example, it may be about 50 cm³/minute to about 500 cm³/minute, but it is not limited thereto.

Thereafter, the semiconductor substrate (430) and the polishing pad (410) rotate relatively to each other, so that the surface of the semiconductor substrate (430) is polished. In such event, the rotation direction of the semiconductor substrate (430) and the rotation direction of the polishing pad (410) may be the same direction or opposite directions. The rotation speeds of the semiconductor substrate (430) and the polishing pad (410) may each be selected according to the purpose within a range of about 10 rpm to about 500 rpm. For example, it may be about 30 rpm to about 200 rpm, but it is not limited thereto.

The semiconductor substrate (430) mounted on the polishing head (460) is pressed against the polishing surface of the polishing pad (410) at a predetermined load to be in contact therewith, and the surface thereof may then be polished. The load applied to the polishing surface of the polishing pad (410) through the surface of the semiconductor substrate (430) by the polishing head (460) may be selected according to the purpose within a range of about 1 gf/cm² to about 1,000 gf/cm². For example, it may be about 10 gf/cm² to about 800 gf/cm², but it is not limited thereto.

In an embodiment, the semiconductor substrate (430) as an object to be polished may comprise an oxide layer, a tungsten layer, or a composite layer thereof. Specifically, the semiconductor substrate (430) may comprise an oxide layer, a tungsten layer, or a composite layer of an oxide layer and a tungsten layer. The composite layer of an oxide layer and a tungsten layer may be a multilayer film in which the tungsten layer is laminated on one side of the oxide layer or may be a single-layer film in which an oxide region and a tungsten region are mixed in a single layer. As the object to be polished has such a film substance, and, at the same time, the polishing pad has predetermined electrical properties according to Relationship 2, a semiconductor device fabricated according to the process for preparing a semiconductor device may have excellent flatness and circuit characteristics.

In an embodiment, the process for preparing a semiconductor device may further comprise, in the step of polishing the object to be polished, supplying any one of a slurry for polishing an oxide layer and a slurry polishing for a tungsten layer; or sequentially supplying the slurry for polishing an oxide layer and the slurry for polishing a tungsten layer to the polishing surface.

For example, if the semiconductor substrate as an object to be polished comprises an oxide layer, the process for preparing a semiconductor device may comprise supplying a slurry for polishing an oxide layer. If the semiconductor substrate comprises a tungsten layer, the process for preparing a semiconductor device may comprise supplying a slurry for polishing a tungsten layer. If the semiconductor substrate comprises a composite layer of an oxide layer and a tungsten layer, the process for preparing a semiconductor device may comprise sequentially supplying a slurry for polishing an oxide layer and a slurry for polishing a tungsten layer to the polishing surface. Here, depending on the process, the slurry for polishing an oxide layer may be supplied first and then the slurry for polishing a tungsten layer may be supplied later, or the slurry for polishing a tungsten layer may be supplied first and then the slurry for polishing an oxide layer may be supplied later.

In an embodiment, the process for preparing a semiconductor device may further comprise, in the step of polishing the object to be polished, supplying a slurry for polishing an oxide layer. For example, the process for preparing a semiconductor device may further comprise, in the step of polishing the object to be polished, supplying any one of a slurry comprising silica particles (a silica slurry) and a slurry comprising ceria particles (a ceria slurry) as a slurry for polishing an oxide layer; or sequentially supplying the slurry comprising silica particles and the slurry comprising ceria particles to the polishing surface.

For example, the semiconductor substrate as an object to be polished may comprise an oxide layer, and the process may further comprise supplying a slurry comprising silica particles as a slurry for polishing an oxide layer. Alternatively, the process may further comprise supplying a slurry comprising ceria particles as a slurry for polishing an oxide layer. Alternatively, the process may further comprise sequentially supplying a slurry comprising silica particles and a slurry comprising ceria particles to the polishing surface. Here, depending on the process, the slurry comprising silica particles may be supplied first and then the slurry comprising ceria particles may be supplied later, or the slurry comprising ceria particles may be supplied first and then the slurry comprising silica particles may be supplied later.

In an embodiment, in order to maintain the polishing surface of the polishing pad (410) in a state suitable for polishing, the process for preparing a semiconductor device may further comprise processing the polishing surface of the polishing pad (410) with a conditioner (470) simultaneously with polishing the semiconductor substrate (430).

In the polishing pad according to an embodiment, the polishing surface of the polishing layer has predetermined surface zeta potential characteristics, whereby it is possible to achieve an appropriate range of polishing rate in a polishing environment using both a silica slurry and a ceria slurry, to minimize such surface defects as scratches and chatter marks, and to continuously or discontinuously apply a single polishing pad to the respective process steps in the above environments. As a result, it is possible to efficiently fabricate a semiconductor device of excellent quality using the polishing pad.

EMBODIMENTS FOR CARRYING OUT THE INVENTION

Hereinafter, the present invention will be described in detail with reference to examples. These examples are set forth to illustrate the present invention, and the scope of the present invention is not limited thereto.

Example 1

1-1: Preparation of a Urethane-Based Prepolymer

A four-necked flask was charged with 2,4-toluene diisocyanate (2,4-TDI), 2,6-toluene diisocyanate (2,6-TDI), dicyclohexylmethane diisocyanate (H12MDI), polytetramethylene ether glycol (PTMEG), and diethylene glycol (DEG), followed by reaction thereof at 80° C. for 3 hours, thereby preparing a urethane-based prepolymer having a content of NCO groups of 9.1% by weight.

1-2: Configuration of the Device

A device equipped with a urethane-based prepolymer tank, a curing agent tank, and an inert gas feeding line directly or indirectly connected to a mold was prepared. The urethane-based prepolymer tank was charged with the urethane-based prepolymer previously prepared and a solid phase foaming agent (manufacturer: Akzonobel, product name: Expancel 551 DE 40 d42, average particle diameter: 40 μm), followed by mixing thereof. The solid phase foaming agent was employed in an amount of 2.2 parts by weight based on 100 parts by weight of the urethane-based prepolymer. The curing agent tank was charged with 4,4'-methylenebis(2-chloroaniline) (MOCA).

1-3: Preparation of a Polishing Layer

The urethane-based prepolymer, the solid phase foaming agent, and the curing agent were stirred while they were fed to the mixing head at certain rates through the respective feeding lines. The curing agent was employed in an amount of 25 parts by weight based on 100 parts by weight of the urethane-based prepolymer. The rotation speed of the mixing head was about 5,000 rpm. The mixture composition comprising the urethane-based prepolymer, the solid phase foaming agent, and the curing agent mixed in the mixing head was then injected into a mold having a width of 1,000 mm, a length of 1,000 mm, and a height of 3 mm. The temperature of the mold was adjusted to about 80 (±5)° C. The mixture composition was solidified in the mold to prepare a sheet for a polishing layer. The sheet was post-cured at about 110 (±5° C.) for about 18 hours to prepare a polishing layer.

1-4: Preparation of a Polishing Pad

One side of the polishing layer was subjected to line turning using a cutting tool and grooved using a tip to have an average thickness of 2 mm. A polyester fiber nonwoven fabric was impregnated with a polyurethane resin to prepare a cushion layer. A heat-sealing adhesive was applied to one side of the cushion layer and to the side of the polishing layer opposite to the polishing surface, respectively. The cushion layer and the polishing layer were laminated such that the sides to which the heat-sealing adhesive had been applied were in contact, which was then pressed using a pressing roller at a temperature of about 140 (+5° C.) and a pressure of 2 kgf/cm² to prepare a polishing pad.

Example 2

A polishing pad was prepared in the same manner as in Example 1, except that a solid phase foaming agent (manufacturer: Akzonobel, product name: Expancel 461 DE 20 d70, average particle diameter: 20 μm) was used as a foaming agent as shown in Table 1 below to adjust the number average diameter of pores in the polishing layer.

Example 3

As shown in Table 1 below, a solid phase foaming agent (manufacturer: Akzonobel, product name: Expancel 551 DE 40 d42, average particle diameter: 40 μm) was used as a foaming agent. When the mixture composition comprising the urethane-based prepolymer, the solid phase foaming agent, and the curing agent was mixed in the mixing head, a gas phase foaming agent (nitrogen gas ($N_2$)) was mixed through a separate feeding line. The solid phase foaming agent was employed in an amount of 1.5 parts by weight based on 100 parts by weight of the urethane-based prepolymer. Meanwhile, a silicone surfactant (manufacturer: Evonik, product name: B8462) as a surfactant was added during the preparation of the mixture composition. A polishing pad was prepared in the same manner as in Example 1, except that the number average diameter of pores in the polishing layer and the content of inorganic substances were adjusted thereby.

Example 4

As shown in Table 1 below, only a gas phase foaming agent, nitrogen gas ($N_2$), without a solid phase foaming agent, was used as a foaming agent, and a surfactant was added during the preparation of a mixture composition comprising the urethane-based prepolymer and the curing agent. A polishing pad was prepared in the same manner as in Example 1, except that the content of the curing agent, the number average diameter of pores in the polishing layer, and the content of inorganic substances were adjusted as shown in Table 1 below.

Example 5

A polishing pad was prepared in the same manner as in Example 3, except that dimethyl thio-toluene diamine (DMTDA) was used as a curing agent, and the number average diameter of pores in the polishing layer and the content of inorganic substance (Si) were adjusted as shown in Table 1 below.

Comparative Example 1

A polishing pad was prepared in the same manner as in Example 3, except that the type of the solid phase foaming agent (manufacturer: Akzonobel, product name: Expancel 461 DET 40 d25, average particle diameter: 40 μm) was changed, and the number average diameter of pores in the polishing layer and the content of inorganic substances were adjusted as shown in Table 1 below.

Comparative Example 2

A polishing pad was prepared in the same manner as in Comparative Example 1, except that dimethyl thio-toluene diamine (DMTDA) was used as a curing agent, and the number average diameter of pores in the polishing layer and the content of inorganic substances were adjusted as shown in Table 1 below.

Specific components and characteristics of the polishing layer are summarized in Table 1 below.

Parts by weight in Table 1 below are values based on 100 parts by weight of the urethane-based prepolymer.

TABLE 1

| | | | Ex. 1 | Ex. 2 | Ex. 3 | Ex. 4 | Ex. 5 | C. Ex. 1 | C. Ex. 2 |
|---|---|---|---|---|---|---|---|---|---|
| Preparation of pad | Content of curing agent (part by weight) | | MOCA (25) | MOCA (25) | MOCA (25) | MOCA (25) | DMTDA (21.4) | MOCA (25) | DMTDA (21.4) |
| | Foaming agent (% by volume based on total pore volume) | Solid phase | Solid phase B 100% | Solid phase C 100% | Solid phase B 50% | — | Solid phase B 50% | Solid phase A 50% | Solid phase A 50% |
| | | Gas phase | — | — | $N_2$ 50% | $N_2$ 100% | $N_2$ 50% | $N_2$ 50% | $N_2$ 50% |
| | Surfactant content (part by weight) | | 0 | 0 | 0.5 | 0.5 | 0.5 | 0.5 | 0.5 |
| | Number average diameter of pores (um) | | 24.1 | 16.0 | 21.0 | 26.0 | 21.0 | 24.0 | 21.0 |
| | Content of inorganic substances (%) | | 300 | 223 | 103 | 0 | 165 | 9740 | 9536 |

Solid phase A: solid phase foaming agent - manufacturer: Akzonobel, product name: Expancel 461 DET 40 d25, average particle diameter: 40 pm
Solid phase B: solid phase foaming agent - manufacturer: Akzonobel, product name: Expancel 551 DE 40 d42, average particle diameter: 40 um
Solid phase C: solid phase foaming agent - manufacturer: Akzonobel, product name: Expancel 461 DE 20 d70, average particle diameter: 20 pm
The % by volume of the solid phase foaming agent and the gas phase foaming agent may mean the % by volume of the pores derived by each of the foaming agents.

Evaluation

Experimental Example 1: Preparation of a Polishing Slurry

As shown in Table 2 below, a first polishing slurry, a second polishing slurry, and a third polishing slurry were prepared.

TABLE 2

| Type of slurry | First polishing slurry Silica slurry | Second polishing slurry Colloidal silica slurry | Third polishing slurry Ceria slurry |
|---|---|---|---|
| Composition | Fumed silica particles: 12% by weight pH adjuster (KOH): 0.2% | Colloidal silica: 3% by weight Amino acid: 0.1% Organic acid: 0.05% Sugar alcohol: 1% | Wet ceria particles: 5% by weight Dispersant: polyacrylic acid: 0.2% |

TABLE 2-continued

| Type of slurry | First polishing slurry Silica slurry | Second polishing slurry Colloidal silica slurry | Third polishing slurry Ceria slurry |
|---|---|---|---|
| | Balanced amount of deionized water | | |
| Solids content (% by weight) | 12 | 4 | 5 |
| pH | 10.5 | 4.0 | 8.5 |
| Zeta potential of slurry (mV) | −41.3 mV | +21.9 mV | −44.9 mV |
| Average pore size (μm) | 150 nm | 40 nm | 150 nm |
| Diluted concentration | 12% → 0.5% sol. | 4% → 0.1% sol. | 5% → 0.5% sol. |

Test Example 2: Measurement of the Physical Properties of the Polishing Pad 2-1: Measurement of the Surface Zeta Potential of the Polishing Pad The surface zeta potential of the polishing pads of the Examples and Comparative Examples was measured using a zeta potential measuring device, ZETASIZER Nano-ZS90 (Malvern).

The zeta potential measuring device is a dip cell type, has an electrode at the end of the barrel (a specimen is attached between them), and comprises an avalanche photodiode detection system.

Specifically, FIG. 3 is a schematic diagram illustrating a surface zeta potential cell. Referring to FIG. 3, a specimen (4 mm×5 mm, 20 mm$^2$) of the polishing pads obtained in the Examples and Comparative Examples were attached to the sample holder (310) using double-sided adhesive tape. The cuvette (330) was charged with 2 ml of the first polishing slurry, the second polishing slurry, or the third polishing slurry as diluted to the dilution concentration shown in Table 2. The electrophoretic mobility was measured using the Ag/AgCl reversible electrode (320). The measured electrophoretic mobility was converted as a function of the distance from the sample surface. The surface zeta potential of the polishing pad was calculated using the following Relationship 1.

Surface zeta potential=(−) zeta potential of the fixed layer+zeta potential of the composition  [Relationship 1]

In Relationship 1, the zeta potential of the fixed layer (110) was extrapolated by measuring the ion diffusion layer (120) of FIG. 1.

FIG. 2 is a graph showing the apparent zeta potential measured for the surface displacement of the polishing pad of Example 1. Specifically, the apparent zeta potential for the surface displacement for the polishing surface of the polishing pad of Example 1 was measured using the first polishing slurry having a zeta potential of −41.3 mV as a tracer. The mean value and the regression fit graph for this were drawn. For the first polishing slurry having a zeta potential of −41.3 mV, the first surface zeta potential (PZ1), which is a surface zeta potential value derived by Relationship 1, was measured to be −60.5 mV. Here, the zeta potential of the fixed layer was 19.2 mV, the surface equivalent mobility value was −4.744 (μm·cm/Vs), the surface zeta potential uncertainty value was 4.31 (mV), and the surface equivalent mobility uncertainty value was 0.3377 (μm·cm/Vs).

The surface zeta potentials of the respective polishing pads of the Examples and Comparative Examples measured according to the type of polishing slurry in this manner are shown in Table 3 below.

2-2: Measurement of Polishing Rates for Tungsten and Oxides

<Polishing Rate for a Tungsten (W) Layer>

A silicon wafer having a size of 300 mm with a tungsten (W) layer formed by a CVD process was set in a CMP polishing machine. The silicon wafer was set on the polishing pad mounted on the platen, while the tungsten layer of the silicon wafer faced downward. Thereafter, the tungsten layer was polished under a polishing load of 2.8 psi while the platen was rotated at a speed of 115 rpm for 30 seconds and the second polishing slurry (a colloidal silica slurry) was supplied onto the polishing pad at a rate of 190 ml/min. Upon completion of the polishing, the silicon wafer was detached from the carrier, mounted in a spin dryer, washed with deionized water (DIW), and then dried with air for 15 seconds. The difference in film thickness of the dried silicon wafer before and after the polishing was measured using a contact type sheet resistance measuring instrument (with a 4-point probe). The polishing rate was calculated using the following Equation 1.

Polishing rate (Å/min)=difference in thickness before and after polishing (Å)/polishing time (minute)  [Equation 1]

<Polishing Rate for an Oxide Layer>

In addition, a silicon wafer having a size of 300 mm with a silicon oxide (SiOx) layer formed by a TEOS-plasma CVD process was used, instead of the silicon wafer with a tungsten layer, in the same device. The silicon wafer was set on the polishing pad mounted on the platen, while the silicon oxide layer of the silicon wafer faced downward. Thereafter, the silicon oxide layer was polished under a polishing load of 1.4 psi while the platen was rotated at a speed of 115 rpm for 60 seconds and the first polishing slurry (a fumed silica slurry) or the third polishing slurry (a ceria slurry) was supplied onto the polishing pad at a rate of 190 ml/min. Upon completion of the polishing, the silicon wafer was detached from the carrier, mounted in a spin dryer, washed with deionized water (DIW), and then dried with air for 15 seconds. The difference in film thickness of the dried silicon wafer before and after the polishing was measured using a spectral reflectometer type thickness measuring instrument (manufacturer: Keyence, model: SI-F80R). Then, the polishing rate was calculated with the above Equation 1.

2-3: Measurement of the Number of Surface Defects Such as Scratches and Chatter Marks After the same CMP process as in Test Example (2-2) was carried out using the polishing pads of the Examples and Comparative Examples, the surface of the wafer was observed using wafer inspection equipment (AIT XP+, KLA Tencor) to measure the number of surface defects such as scratches and chatter marks appearing on the wafer surface upon the polishing (threshold: 150, die filter threshold: 280).

The scratch means a substantially continuous linear scratch. For example, it means a defect of the shape as shown in FIG. 5.

Meanwhile, the chatter mark means a substantially discontinuous linear scratch. For example, it means a defect of the shape as shown in FIG. 6.

The results are shown in Table 3 below.

TABLE 3

|  |  | Ex. 1 | Ex. 2 | Ex. 3 | Ex. 4 | Ex. 5 | C. Ex. 1 | C. Ex. 2 |
|---|---|---|---|---|---|---|---|---|
| Zeta potential of slurry (mV) | First polishing slurry (SZ1) | −41.3 | −41.3 | −41.3 | −41.3 | −41.3 | −41.3 | −41.3 |
|  | Second polishing slurry (SZ2) | 21.9 | 21.9 | 21.9 | 21.9 | 21.9 | 21.9 | 21.9 |
|  | Third polishing slurry (SZ3) | −44.9 | −44.9 | −44.9 | −44.9 | −44.9 | −44.9 | −44.9 |
| Zeta potential of fixed layer (mV) | First polishing slurry (IZ1) | 19.2 | 22.8 | 16.9 | 21.8 | 11.2 | 0.4 | −2 |
|  | Second polishing slurry (IZ2) | −0.7 | 2.6 | 0 | −0.5 | 5.7 | 20.4 | 21.34 |
|  | Third polishing slurry (IZ3) | −2.8 | −8.8 | −5.4 | 5.6 | 3.5 | 17.1 | 16 |
| Surface zeta potential of pad (mV) | PZ1 | −60.5 | −64.1 | −58.2 | −63.1 | −52.5 | −41.7 | −39.3 |
|  | PZ2 | 22.6 | 19.3 | 21.9 | 22.4 | 16.2 | 1.5 | 0.56 |
|  | PZ3 | −42.1 | −36.1 | −39.5 | −50.5 | −48.4 | −62 | −60.9 |
|  | PZ1/PZ2 | −2.68 | −3.32 | −2.66 | −2.82 | −3.24 | −27.80 | −70.18 |
|  | PZ1/PZ3 | 1.44 | 1.78 | 1.47 | 1.25 | 1.08 | 0.67 | 0.65 |
|  | PZ1 × PZ2/PZ3 | 32.48 | 34.27 | 32.27 | 27.99 | 17.57 | 1.01 | 0.36 |
|  | (PZ2 − PZ1)/(PZ2 − PZ3) | 1.28 | 1.51 | 1.30 | 1.17 | 1.06 | 0.68 | 0.65 |
|  | PZ1 − SZ1 | −19.2 | −22.8 | −16.9 | −21.8 | −11.2 | −0.4 | 2 |
|  | PZ2 − SZ2 | 0.7 | −2.6 | 0 | 0.5 | −5.7 | −20.4 | −21.34 |
|  | PZ3 − SZ3 | 2.8 | 8.8 | 5.4 | −5.6 | −3.5 | −17.1 | −16 |
| Polishing rate (Å/min) | OR1 | 2,931 | 2,950 | 2,932 | 2,894 | 2,948 | 2,940 | 2,938 |
|  | WR2 | 790 | 780 | 795 | 800 | 785 | 790 | 782 |
|  | OR3 | 2,373 | 2,256 | 2,486 | 2,583 | 2,396 | 2,495 | 2,391 |
|  | OR1/WR2 | 3.71 | 3.78 | 3.68 | 3.61 | 3.75 | 3.72 | 3.76 |
|  | OR1/OR3 | 1.23 | 1.30 | 1.17 | 1.12 | 1.23 | 1.18 | 1.23 |
|  | OR1 × WR2/OR3 | 975.76 | 1019.94 | 937.62 | 896.32 | 965.85 | 930.90 | 960.90 |
|  | (WR2 − OR1)/(WR2 − OR3) | 1.35 | 1.47 | 1.26 | 1.17 | 1.34 | 1.26 | 1.34 |
| No. of scratches and chatter marks (count) | First polishing slurry | <5 | <5 | <5 | <5 | <5 | 30 | 30 |
|  | Second polishing slurry | <5 | <5 | <5 | <5 | <5 | <10 | <10 |
|  | Third polishing slurry | <5 | <5 | <5 | <5 | <5 | 45 | 45 |

PZ1: Surface zeta potential of the polishing pad by the above Relationship 1 measured using the first polishing slurry
PZ2: Surface zeta potential of the polishing pad by the above Relationship 1 measured using the second polishing slurry
PZ3: Surface zeta potential of the polishing pad by the above Relationship 1 measured using the third polishing slurry
OR1: Polishing rate of the polishing pad for an oxide layer using the first polishing slurry
WR2: Polishing rate of the polishing pad for a tungsten layer using the second polishing slurry
OR3: Polishing rate of the polishing pad for an oxide layer using the third polishing slurry As can be seen from Table 3, when the surface zeta potential desired in the present invention was satisfied, the polishing rate and the effect of reducing surface defects such as scratches and chatter marks were remarkably excellent as compared with the cases where the polishing pads of Comparative Examples 1 and 2 were used.

Specifically, regarding the polishing rate of the polishing pads of Examples 1 to 5, the polishing rate (OR1) of the polishing pad for an oxide layer using the first polishing slurry was 2,894 Å/min to 2,950 Å/min, the polishing rate (WR2) of the polishing pad for a tungsten layer using the second polishing slurry was 780 Å/min to 800 Å/min, and the polishing rate (OR3) of the polishing pad for an oxide layer using the third polishing slurry was 2,256 Å/min to 2,583 Å/min. An appropriate polishing rate was achieved for the respective types of slurry for the film substances to be polished.

In addition, regarding the surface defects such as scratches and chatter marks of the polishing pads of Examples 1 to 5, the number of surface defects such as scratches and chatter marks on the wafer surface were all less than 5, whereas the number of surface defects such as scratches and chatter marks on the wafer surface when the polishing pads of Comparative Examples 1 and 2 were used was significantly increased by 9 times or more as compared with the cases where the polishing pads of the Examples were used.

As confirmed from the above, in the polishing pads according to the Examples, the surface zeta potential and its ratio were controlled to specific ranges according to the type of polishing slurry, whereby it was possible to produce an excellent effect of achieving excellent polishing performance for both an oxide film substance and a tungsten film substance and improving the surface defects such as scratches and chatter marks appearing on the surface of a semiconductor substrate. That is, the polishing pad achieved appropriate polishing performance for both an oxide film substance and a tungsten film substance with a single polishing pad, thereby producing the advantage that it can be applied continuously and discontinuously to various polishing environments for objects of different materials to be polished.

In addition, in the polishing pads according to the Examples, it was possible to achieve excellent polishing performance for an oxide layer. Specifically, it was possible to apply continuous and discontinuous processes in both of bulk and fine processes for an oxide layer, while securing excellent polishing performance for both, resulting in advantages from the viewpoint of multiple processes.

In addition, the polishing pads according to the Examples achieved excellent polishing performance in the polishing environments using silica and ceria slurries, thereby producing the advantage that it can be applied continuously and discontinuously to various polishing environments by different types of slurry.

Further, in the polishing pads according to the Examples, it is possible to achieve excellent polishing performance with a single pad in the polishing environments when the slurry environment is acidic and basic, or silica and ceria slurries are used.

REFERENCE NUMERAL OF THE DRAWINGS

100, 410: polishing pad
10: polishing layer
11: polishing surface
20: cushion layer
30: adhesive layer
110: fixed layer
120: ion diffusion layer
130: slipping plane
310: sample holder
320: electrode
330: cuvette
420: platen
430: semiconductor substrate
440: nozzle
450: polishing slurry
460: polishing head
470: conditioner

The invention claimed is:

1. A polishing pad after application of a polishing composition thereto and during polishing, comprising:
a polishing layer; and
a particulate layer comprising particles of a polishing composition being stably present on a polishing surface of the polishing layer,
wherein the polishing composition is selected from the group consisting of a first composition having a hydrogen ion concentration (pH) of 8 to 12, a second composition having a hydrogen ion concentration (pH) of 2 to 6, and a third composition including ceria particles and having a hydrogen ion concentration (pH) of 7.5 to 9.5,
wherein when polishing is carried out using the first composition of the polishing composition having the hydrogen ion concentration (pH) of 8 to 12, the polishing surface of the polishing layer has a first surface zeta potential (PZ1), which is a value associated with suspended particles in the first composition separated from the particulate layer by a first slipping plane present during the polishing and derived by the following Relationship 1 for the first composition;
when polishing is carried out using the second composition of the polishing composition having the hydrogen ion concentration (pH) of 2 to 6, the polishing surface of the polishing layer has a second surface zeta potential (PZ2), which is a value associated with the suspended particles in the second composition separated from the particulate layer by a second slipping plane present during the polishing and derived by the following Relationship 1 for the second composition; and
the first surface zeta potential (PZ1) and the second surface zeta potential (PZ2) satisfy the following Relationship 2:

Surface zeta potential=(−) zeta potential of the particulate layer+zeta potential of the polishing composition,  [Relationship 1]

$$-20 \leq \frac{PZ1}{PZ2} \leq 0,$$  [Relationship 2]

wherein the polishing layer comprises a polyurethane foam having a porous structure comprising a plurality of pores wherein the number average diameter of the plurality of pores ranges from 10 µm to 40 µm and the polyurethane foam is a cured product of a composition comprising a urethane-based prepolymer, a curing agent, a silicone-based surfactant, and a foaming agent, and a content of an inorganic substance in the polishing layer ranges from 5 ppm to 500 ppm,
wherein a content of the curing agent ranges from 18 parts by weight to 27 parts by weight based on 100 parts by weight of the urethane-based prepolymer,
wherein a content of the silicone-based surfactant ranges from 0.2 part by weight to 2 parts by weight based on 100 parts by weight of the urethane-based prepolymer,
wherein the inorganic substance comprises at least one element selected from the group consisting of a silicon (Si) element, a phosphorus (P) element, and a calcium (Ca) element, and
wherein when polishing is carried out using the third composition of the polishing composition including the ceria particles and having the hydrogen ion concentration (pH) of 7.5 to 9.5, the polishing surface of the polishing layer has a third surface zeta potential (PZ3), which is a value of surface zeta potential of the polishing surface derived by the above Relationship 1 for the third composition, and
first surface zeta potential (PZ1) and the third surface zeta potential (PZ3) satisfy the following Relationship 3:

$$1 \leq \frac{PZ1}{PZ3} \leq 5.$$  [Relationship 3]

2. The polishing pad of claim 1, wherein the first surface zeta potential (PZ1), the second surface zeta potential (PZ2), and the third surface zeta potential (PZ3) satisfy the following Relationship 4:

$$1.1 \leq \frac{PZ1 \times PZ2}{PZ3} \leq 50.$$  [Relationship 4]

3. The polishing pad of claim 1, wherein the first surface zeta potential (PZ1), the second surface zeta potential (PZ2), and the third surface zeta potential (PZ3) satisfy the following Relationship 5:

$$1 \leq \frac{(PZ2 - PZ1)}{(PZ2 - PZ3)} \leq 5.$$  [Relationship 5]

4. The polishing pad of claim 1, wherein the zeta potential of the particulate layer for the first composition, IZ1, is +5 mV to about +30 mV, and
the zeta potential of the particulate layer for the second composition, IZ2, is −5 mV to about +15 mV.

5. The polishing pad of claim 1, wherein PZ1 is -70 mV to -45 mV, and
PZ2 is +10 mV to +30 mV.

6. The polishing pad of claim 1, wherein the first composition comprises silica particles having an average particle diameter of 130 nm to 160 nm, and
the second composition comprises silica particles having an average particle diameter of 30 nm to 50 nm.

7. The polishing pad of claim 6, wherein the first composition has a zeta potential of -50 mV to -30 mV, and
the second composition has a zeta potential of +10 mV to +30 mV.

8. The polishing pad of claim 1, wherein the zeta potential of the particulate layer for the first composition, IZ1, is +5 mV to about +30 mV, and
the zeta potential of the particulate layer for the third composition, IZ3, is -15 mV to about +10 mV.

9. The polishing pad of claim 1, wherein PZ1 is -70 mV to -45 mV, and PZ3 is -45 mV to -30 mV.

10. The polishing pad of claim 1, wherein the first composition comprises silica particles having an average particle diameter of 130 nm to 160 nm and has a zeta potential of -50 mV to -30 mV, and
the third composition comprises the ceria particles having an average particle diameter of 130 nm to 170 nm and has a zeta potential of -55 mV to -35 mV.

11. The polishing pad of claim 1, wherein the urethane-based prepolymer has an isocyanate end group content (NCO %) of 5% by weight to 11% by weight.

12. The polishing pad of claim 1, wherein the foaming agent comprises a solid phase foaming agent having an average particle diameter of 5 μm to 200 μm, a gas phase foaming agent, or a combination thereof.

13. The polishing pad of claim 1, wherein when a first polishing rate of the polishing surface of the polishing layer for an oxide layer using the first composition is OR1,
when a second polishing rate of the polishing surface of the polishing layer for a tungsten layer using the second composition is WR2, and
when a third polishing rate of the polishing surface of the polishing layer for an oxide layer using the third composition is OR3,
OR1 is 2,750 Å/min to less than 2,955 Å/min, or
WR2 is 730 Å/min to 850 Å/min, or
OR3 is 2,200 Å/min to 2,955 Å/min.

14. A process for preparing a semiconductor device, which comprises:
providing a) a polishing pad comprising a polishing layer and b) a polishing composition providing a particulate layer comprising a layer of particles being stably present on a polishing surface of the polishing layer, wherein the polishing composition is selected from the group consisting of a first composition having a hydrogen ion concentration (pH) of 8 to 12, a second composition having a hydrogen ion concentration (pH) of 2 to 6, and a third composition including ceria particles and having a hydrogen ion concentration (pH) of 7.5 to 9.5; and
relatively rotating the polishing surface of the polishing layer and the surface of an object to be polished while they are in contact with each other to polish the object to be polished,
wherein the object to be polished comprises an oxide layer, a tungsten layer, or a composite layer thereof,
when polishing is carried out using the first composition having the hydrogen ion concentration (pH) of 8 to 12, the polishing surface of the polishing layer has a first surface zeta potential (PZ1), associated with suspended particles in the first composition separated from the particulate layer by a first slipping plane present during the polishing and derived by the following Relationship 1 for the first composition;
when polishing is carried out using the second composition having the hydrogen ion concentration (pH) of 2 to 6, the polishing surface of the polishing layer has a second surface zeta potential (PZ2), associated with the suspended particles in the second composition separated from the particulate layer by a second slipping plane present during the polishing and derived by the following Relationship 1 for the second composition; and
the first surface zeta potential (PZ1) and the second surface zeta potential (PZ2) satisfy the following Relationship 2:

Surface zeta potential=(-) zeta potential of the particulate layer+zeta potential of the polishing composition,      [Relationship 1]

$$-20 \leq \frac{PZ1}{PZ2} \leq 0, \quad \text{[Relationship 2]}$$

wherein the particulate layer is a layer formed by particles being present on the polishing surface,
wherein the polishing layer comprises a polyurethane foam having a porous structure comprising a plurality of pores wherein the number average diameter of the plurality of pores ranges from 10 μm to 40 μm and the polyurethane foam is a cured product of a composition comprising a urethane-based prepolymer, a curing agent, a silicone-based surfactant, and a foaming agent, and a content of an inorganic substance in the polishing layer ranges from 5 ppm to 500 ppm,
wherein a content of the curing agent ranges from 18 parts by weight to 27 parts by weight based on 100 parts by weight of the urethane-based prepolymer,
wherein a content of the silicone-based surfactant ranges from 0.2 part by weight to 2 parts by weight based on 100 parts by weight of the urethane-based prepolymer,
wherein the inorganic substance comprises at least one element selected from the group consisting of a silicon (Si) element, a phosphorus (P) element, and a calcium (Ca) element, and
wherein when polishing is carried out using the third composition including the ceria particles and having the hydrogen ion concentration (pH) of 7.5 to 9.5, the polishing surface of the polishing layer has a third surface zeta potential (PZ3), which is a value of surface zeta potential of the polishing surface derived by the above Relationship 1 for the third composition, and
the first surface zeta potential (PZ1) and the third surface zeta potential (PZ3) satisfy the following Relationship 3:

$$1 \leq \frac{PZ1}{PZ3} \leq 5. \quad \text{[Relationship 3]}$$

15. The process for preparing a semiconductor device of claim 14, which further comprise, in the step of polishing the object to be polished, supplying any one of a slurry for polishing an oxide layer and a slurry for polishing a tungsten layer; or sequentially supplying the slurry for polishing an oxide layer and the slurry for polishing a tungsten layer to the polishing surface.

* * * * *